(12) United States Patent
McPartlin et al.

(10) Patent No.: US 10,263,072 B2
(45) Date of Patent: *Apr. 16, 2019

(54) INTEGRATED RF FRONT END SYSTEM

(71) Applicant: Skyworks Solutions, Inc., Woburn, MA (US)

(72) Inventors: Michael Joseph McPartlin, North Andover, MA (US); Mark M. Doherty, Westford, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/798,129

(22) Filed: Oct. 30, 2017

(65) Prior Publication Data

US 2018/0130876 A1   May 10, 2018

Related U.S. Application Data

(63) Continuation of application No. 15/216,620, filed on Jul. 21, 2016, now Pat. No. 9,818,821, which is a
(Continued)

(51) Int. Cl.
*H01L 29/73* (2006.01)
*H01L 29/06* (2006.01)
(Continued)

(52) U.S. Cl.
CPC .......... *H01L 29/0646* (2013.01); *H01L 21/76* (2013.01); *H01L 21/761* (2013.01);
(Continued)

(58) Field of Classification Search
CPC .............................. H01L 29/0646; H01L 21/76
See application file for complete search history.

(56) References Cited

U.S. PATENT DOCUMENTS 4,764,799 A    8/1988  Malaviya
4,887,144 A   12/1989  Cook et al.
(Continued)

FOREIGN PATENT DOCUMENTS

CN    101452933 A    6/2009
CN    102376692 A    3/2012
(Continued)

OTHER PUBLICATIONS

Lederer, D., et al., "RF Performance of a Commercial SOI Technology Transferred Onto a Passivated H Silicon Substrate", IEEE Transactions on Electron Devices, vol. 55, No. 7, Jul. 2008, 8 pages.
(Continued)

*Primary Examiner* — Tuan H Nguyen
(74) *Attorney, Agent, or Firm* — Knobbe, Martens, Olson & Bear, LLP

(57) ABSTRACT

Systems and methods are disclosed for integrating functional components of front-end modules for wireless radios. Front-end modules disclosed may be dual-band front-end modules for use in 802.11ac-compliant devices. In certain embodiments, integration of front-end module components on a single die is achieved by implementing a high-resistivity layer or substrate directly underneath, adjacent to, and/or supporting SiGe BiCMOS technology elements.

20 Claims, 19 Drawing Sheets

Related U.S. Application Data continuation of application No. 14/703,465, filed on May 4, 2015, now Pat. No. 9,419,073, which is a continuation of application No. 13/536,749, filed on Jun. 28, 2012, now Pat. No. 9,048,284.

(51) Int. Cl.

| | | |
|---|---|---|
| *H01Q 1/24* | (2006.01) | |
| *H01L 27/06* | (2006.01) | |
| *H01L 29/165* | (2006.01) | |
| *H01L 29/737* | (2006.01) | |
| *H01L 23/66* | (2006.01) | |
| *H03F 3/24* | (2006.01) | |
| *H01L 29/08* | (2006.01) | |
| *H01L 21/76* | (2006.01) | |
| *H01L 27/082* | (2006.01) | |
| *H03F 3/195* | (2006.01) | |
| *H01L 21/761* | (2006.01) | |
| *H01L 29/66* | (2006.01) | |

(52) U.S. Cl.
CPC ......... *H01L 23/66* (2013.01); *H01L 27/067* (2013.01); *H01L 27/0823* (2013.01); *H01L 29/0603* (2013.01); *H01L 29/0821* (2013.01); *H01L 29/0826* (2013.01); *H01L 29/165* (2013.01); *H01L 29/66242* (2013.01); *H01L 29/737* (2013.01); *H01L 29/7371* (2013.01); *H01L 29/7378* (2013.01); *H01Q 1/24* (2013.01); *H03F 3/195* (2013.01); *H03F 3/245* (2013.01); *H01L 2223/665* (2013.01); *H01L 2223/6655* (2013.01); *H01L 2223/6677* (2013.01); *H01L 2224/0603* (2013.01); *H01L 2224/48137* (2013.01); *H01L 2224/48247* (2013.01); *H01L 2224/48257* (2013.01); *H01L 2224/48465* (2013.01); *H01L 2224/48471* (2013.01); *H01L 2224/49111* (2013.01); *H01L 2224/49113* (2013.01); *H01L 2224/49171* (2013.01); *H01L 2224/73265* (2013.01); *H01L 2924/181* (2013.01); *H01L 2924/1815* (2013.01); *H03F 2200/222* (2013.01); *H03F 2200/294* (2013.01); *H03F 2200/318* (2013.01); *H03F 2200/387* (2013.01); *H03F 2200/411* (2013.01); *H03F 2200/451* (2013.01)

(56) References Cited

U.S. PATENT DOCUMENTS

| | | |
|---|---|---|
| 5,291,040 A | 3/1994 | Oppermann et al. |
| 5,485,029 A | 1/1996 | Crabbe et al. |
| 5,523,606 A | 6/1996 | Yamazaki |
| 5,559,349 A | 9/1996 | Cricchi et al. |
| 5,969,405 A | 10/1999 | Aeugle |
| 5,994,755 A | 11/1999 | DeJong et al. |
| 6,011,297 A | 1/2000 | Rynne |
| 6,066,520 A | 5/2000 | Suzuki |
| 6,169,007 B1 | 1/2001 | Pinter |
| 6,313,000 B1 | 11/2001 | Kitch |
| 6,600,199 B2 | 7/2003 | Voldman et al. |
| 6,657,242 B1 | 12/2003 | Norstrom et al. |
| 6,709,941 B2 | 3/2004 | Fujimaki |
| 6,846,710 B2 | 1/2005 | Yi et al. |
| 6,878,976 B2 | 4/2005 | Coolbaugh et al. |
| 6,933,201 B2 | 8/2005 | Tominari et al. |
| 6,943,428 B2 | 9/2005 | Furukawa et al. |
| 7,115,459 B2 | 10/2006 | Bae et al. |
| 7,372,408 B2 | 5/2008 | Gaucher et al. |
| 7,449,389 B2 | 11/2008 | Meister et al. |
| 7,521,733 B2 | 4/2009 | Dahl et al. |
| 7,596,364 B2 | 9/2009 | Sjoland |
| 7,605,660 B1 | 10/2009 | Kobayashi et al. |
| 7,705,426 B2 | 4/2010 | Voldman |
| 7,883,954 B2 | 2/2011 | Magnee et al. |
| 8,207,580 B2 * | 6/2012 | Parthasarathy ..... H01L 27/0629 257/337 |
| 8,373,236 B2 | 2/2013 | Hijzen et al. |
| 8,415,762 B2 | 4/2013 | Yoshida et al. |
| 9,048,284 B2 | 6/2015 | McPartlin et al. |
| 9,419,073 B2 | 8/2016 | McPartlin et al. |
| 9,761,700 B2 | 9/2017 | McPartlin et al. |
| 9,818,821 B2 | 11/2017 | McPartlin et al. |
| 2004/0099878 A1 | 5/2004 | Huang et al. |
| 2004/0217444 A1 | 11/2004 | Ooms et al. |
| 2005/0282510 A1 | 12/2005 | Bang et al. |
| 2007/0178639 A1 | 8/2007 | Cecchi et al. |
| 2007/0246790 A1* | 10/2007 | Zinn ................ H01L 29/0878 257/492 |
| 2008/0136528 A1 | 6/2008 | Sjoland |
| 2008/0159363 A1 | 7/2008 | Rofougaran |
| 2009/0140376 A1 | 6/2009 | Kim |
| 2010/0109796 A1 | 5/2010 | Park et al. |
| 2010/0301412 A1 | 12/2010 | Parthasarathy et al. |
| 2011/0021585 A1 | 1/2011 | Choi et al. |
| 2011/0170231 A1 | 7/2011 | Chandrasekaran et al. |
| 2011/0175789 A1 | 7/2011 | Lee et al. |
| 2012/0262217 A1 | 10/2012 | Gorbachov et al. |
| 2013/0140668 A1 | 6/2013 | Botula et al. |
| 2013/0196493 A1 | 8/2013 | Botula et al. |
| 2014/0001567 A1 | 1/2014 | McPartlin |
| 2014/0001602 A1 | 1/2014 | McPartlin |
| 2014/0001608 A1 | 1/2014 | McPartlin |
| 2015/0206951 A1 | 7/2015 | Lin et al. |
| 2017/0018607 A1 | 1/2017 | McPartlin et al. |
| 2018/0019329 A1 | 1/2018 | McPartlin |

FOREIGN PATENT DOCUMENTS

| | | |
|---|---|---|
| JP | 2001119019 A | 4/2001 |
| JP | 2004063780 A | 2/2004 |
| JP | 2008085359 A | 4/2008 |
| WO | WO 2014/004535 | 1/2014 |

OTHER PUBLICATIONS

Neve, C.R., et al., "Impact of Si Substrate Resistivity on the Non-Linear Behaviour of RF CPW Transmission Lines", Proceedings of the 3rd European Microwave Integrated Circuits Conference, Oct. 2008, 4 pages.

Neve, C.R., et al., "RF Harmonic Distortion of CPW Lines on HR-Si and Trap-Rich HR-Si Substrates", IEEE Transactions on Electron Devices, vol. 59, No. 4, Apr. 2012, 9 pages.

International Search Report dated Oct. 8, 2013 of PCT/US2013/047658 in 17 pages.

International Preliminary Report on Patentability in PCT/US2013/047658 dated Dec. 31, 2014, 11 pages.

* cited by examiner

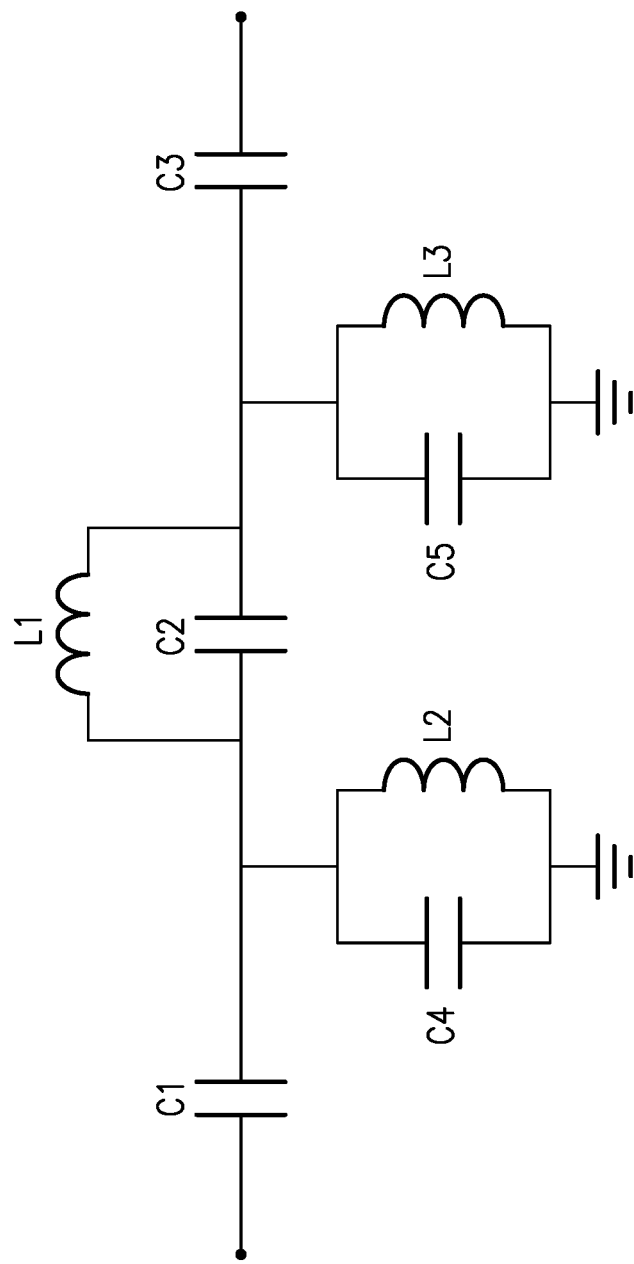

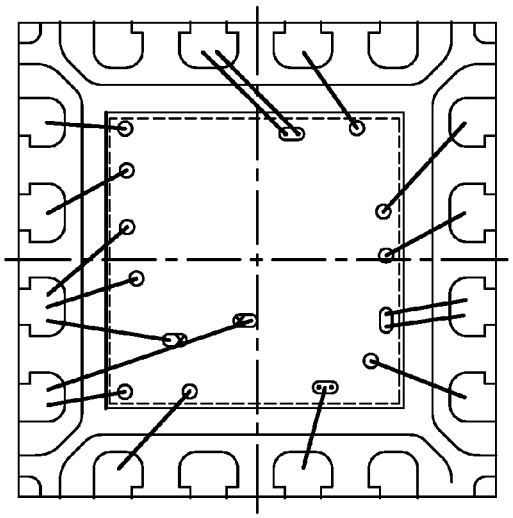
FIG.12B
FIG.12D
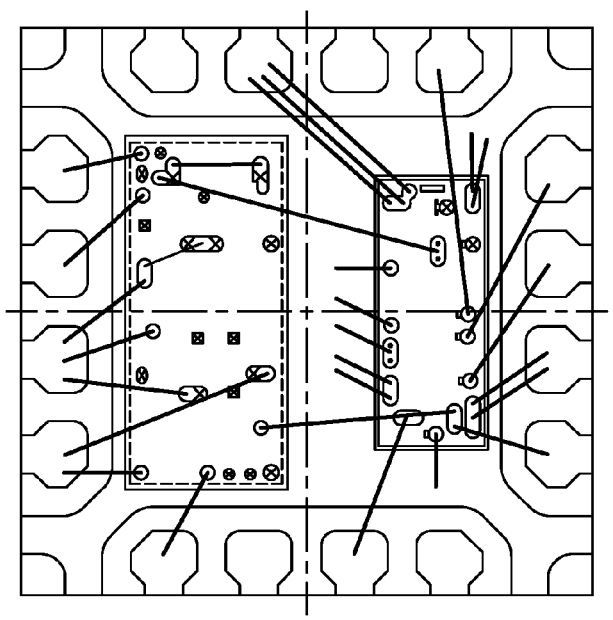
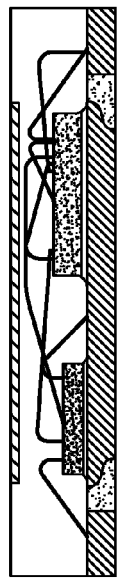
FIG.12A
FIG.12C

INTEGRATED RF FRONT END SYSTEM

RELATED APPLICATIONS

This disclosure is a continuation of and claims priority to U.S. application Ser. No. 15/216,620 filed Jul. 21, 2016 and titled "INTEGRATED RF FRONT END SYSTEM," the disclosure of which is hereby expressly incorporated by reference herein in its entirety and which is a continuation of and claims priority to U.S. application Ser. No. 14/703,465 filed May 4, 2015 and titled "INTEGRATED RF FRONT END SYSTEM," the disclosure of which is hereby expressly incorporated by reference herein in its entirety and which is a continuation of U.S. application Ser. No. 13/536,749 filed Jun. 28, 2012 and titled "INTEGRATED RF FRONT END SYSTEM," the disclosure of which is expressly incorporated by reference herein in its entirety.

BACKGROUND

Field

The present disclosure generally relates to the field of electronics, and more particularly, to radio frequency front-end modules.

Description of Related Art

Radio frequency (RF) is a common term for a range of frequency of electromagnetic radiation typically used to produce and detect radio waves. Such a range can be from about 30 kHz to 300 GHz. Wireless communication devices often include front-end circuitry for processing or conditioning RF signals at an incoming or outgoing frequency or signal port. RF front-end modules may be components of receiver, transmitter, or transceiver systems associated with a wireless device.

RF front-end design may include a number of considerations, including complexity, substrate compatibility, performance, and integration.

SUMMARY

Certain embodiments provide functional integration of all necessary and desirable building blocks of the front-end circuitry onto a single BiCMOS technology platform featuring a high-resistivity substrate. For example, FEMs may be fully integrated using SiGe BiCMOS technology with high-resistivity layers. An integrated front-end module comprising:

Certain embodiments disclosed herein provide a silicon substrate having a high-resistivity portion and an SiGe bipolar transistor disposed on the substrate above the high-resistivity portion. The front-end module may include a switch disposed on the substrate. The bipolar transistor may be part of a power amplifier module. Such power amplifier module may include, for example, a first power amplifier device configured to amplify RF signals in a first frequency band and a second power amplifier device configured to amplify RF signals in a second frequency band separate from the first frequency band. A signal at 2.4 GHz may be included in the first frequency band, and a signal at 5 GHz may be included in the second frequency band.

The first power amplifier device may be configured to amplify RF signals in accordance with IEEE 802.11b/g specifications and the second power amplifier device may be configured to amplify RF signals in accordance with IEEE 802.11a/ac specifications. Furthermore, the power amplifier module may include a multi-stage power amplifier. For example, the first power amplifier device may be a two-stage power amplifier and the second power amplifier device may be a three-stage power amplifier.

The front-end module may include various other devices. For example, the front-end module may include at least one filter device, or a power detector module at least partially coupled to the power amplifier module. The front-end module may include at least one filter device. The front-end module may include a low-noise amplifier module. The low-noise amplifier module may include a low-noise amplifier bypass switch.

The high-resistivity portion may have a resistivity value greater than approximately 500 Ohm*cm. For example, the high-resistivity portion may have a resistivity of approximately 1 kOhm*cm or greater. Furthermore, the switch may be an SP4T switch, SP5T switch, or other type of switch.

Certain embodiments disclosed herein provide a method of fabricating an integrated front-end module. The method may include providing at least a portion of a high-resistivity bulk silicon substrate and forming one or more bipolar transistors on the high-resistivity substrate. The method may further include implanting a low-resistivity region around the one or more bipolar transistors.

Certain embodiments disclosed herein provide a semiconductor die that includes a silicon substrate including a high-resistivity portion and being configured to receive a plurality of components. The die may further include RF front-end circuitry disposed on the substrate, the RF front-end circuitry including an SiGe bipolar transistor disposed above the high-resistivity portion. The RF front-end circuitry may be configured to process wireless signals in compliance with the IEEE 802.11ac wireless communication standard, or other 801.11 standards. Furthermore, the RF front-end circuitry includes a sixth-order SiGe power amplifier filter.

Certain embodiments disclosed herein provide a radio-frequency (RF) module including a packaging substrate configured to receive a plurality of components, a die mounted on the packaging substrate, the die having a high-resistivity substrate portion, a switch, a power amplifier including an SiGe bipolar transistor disposed above the high-resistivity substrate portion, and one or more passive devices, and a plurality of connectors configured to provide electrical connections between the die and the packaging substrate. The packaging substrate may have an area of less than 3.0 mm2 and may have a height of less than 0.5 mm.

Certain embodiments disclosed herein provide an RF device including a processor configured to process RF signals, RF front-end circuitry disposed on a substrate having a high-resistivity portion, the RF front-end circuitry including a switch, one or more passive devices, and a power amplifier including an SiGe bipolar transistor disposed above the high-resistivity portion, and an antenna in communication with at least a portion of the RF front-end circuitry to facilitate transmission and reception of the RF signals.

BRIEF DESCRIPTION OF THE DRAWINGS

Various embodiments are depicted in the accompanying drawings for illustrative purposes, and should in no way be interpreted as limiting the scope of the inventions. In addition, various features of different disclosed embodiments can be combined to form additional embodiments, which are part of this disclosure. Throughout the drawings, reference numbers may be reused to indicate correspondence between reference elements.

FIGS. 10A and 10B illustrate an embodiments of a coexistence filters for front-end modules in accordance with one or more features of the present disclosure.

FIGS. 12A-12D illustrate embodiments of packaging configurations for front-end modules in accordance with one or more features of the present disclosure.

DETAILED DESCRIPTION

Figure 1:
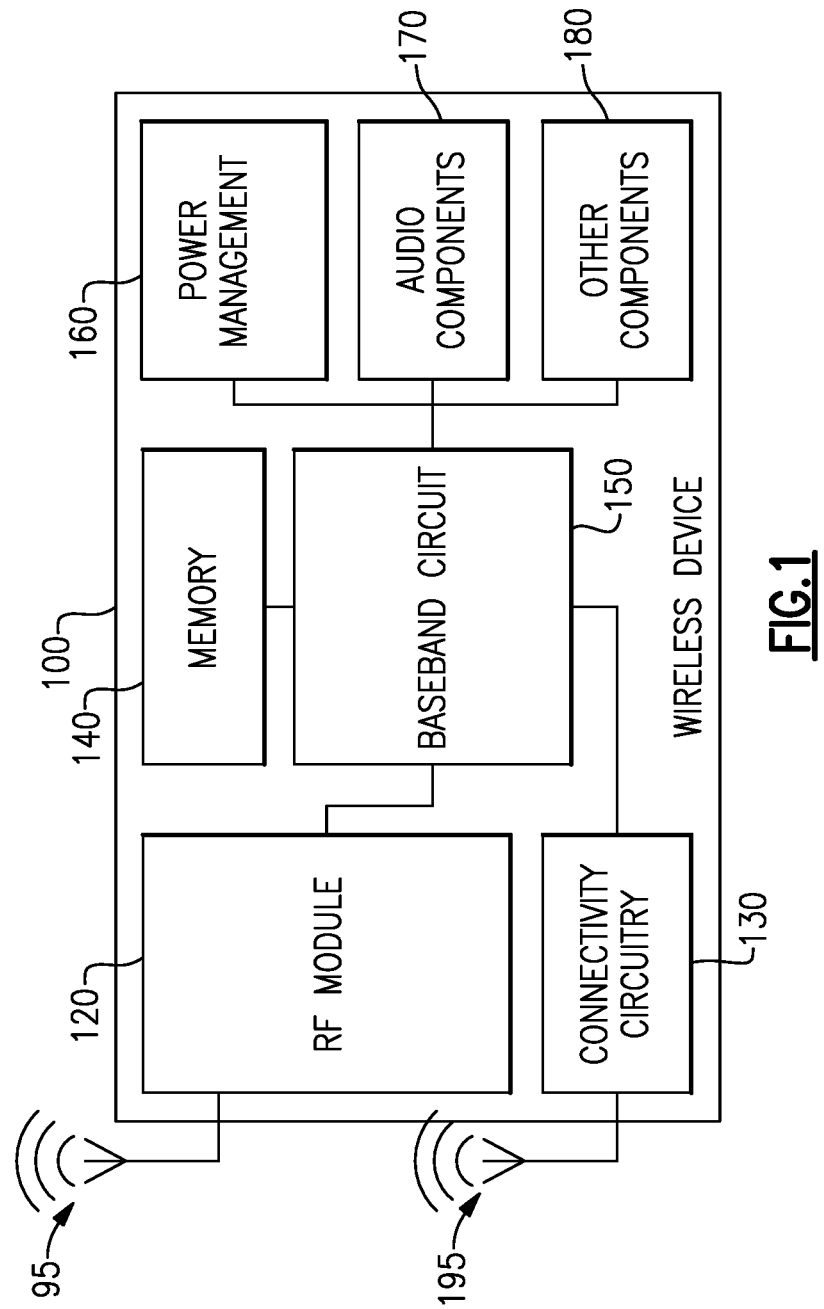
FIG. 1 is a block diagram showing an embodiment of a wireless device in accordance with one or more features of the present disclosure.

Disclosed herein are example configurations and embodiments relating to integrated RF front-end modules (FEMs), such as fully-integrated FEM's. For example, embodiments of integrated SiGe BiCMOS FEM's are disclosed that may enable emerging high throughput 802.11ac WLAN applications.

As discussed above, RF FEM's are incorporated into various types of wireless devices, including computer network radios, cellular phones, PDAs, electronic gaming devices, security and monitoring systems, multi-media systems, and other electronic devices including wireless LAN (WLAN) radios. In the last decade, there have been a number of major trends in the evolution of WLAN radios. For example, with the increasing demand of higher data rate communications, the multiple-input, multiple-output (MIMO) technique has been widely adopted to increase the data rate from the 54 Mbps of a single-input single-output (SISO) operation to 108 Mbps, or more, dual stream MIMO operation. In another example, to avoid bandwidth congestion associated with the 2.4-2.5 GHz band (i.e., 2 GHz band, 2.4 GHz band, g-band), which has only 3 channels for 54 Mbps operation, dual-band (g-band and a-band) WLAN configuration has been increasingly adopted. The a-band (i.e., 5 GHz band, 5.9 Ghz band) WLAN typically operates with signals from 4.9 to 5.9 GHz, which provides an increase in the number of available channels. In yet another example, a front-end module (FEM) or front-end IC (FEIC) is typically a preferred design implementation for the radio front-end design. FEMs or FEICs not only simplify the RF design of radio front-end circuitry but also greatly reduce the layout complexity in a compact radio. For the embedded WLAN radios in portable electronic devices and MIMO radios, FEM and FEIC demonstrate the strength of integration for complicated RF circuit designs.

The emerging IEEE 802.11ac standard is a wireless computer networking standard which provides high throughput WLAN's below 6 GHz (what is commonly referred to as the 5 GHz band). This specification may enable multi-station WLAN throughput of at least 1 Gigabit per second and a maximum single link throughput of at least 500 megabits per second (500 Mbit/s). 802.11ac chipsets are applicable in WiFi routers and consumer electronics, as well as in low-power 802.11ac technology for smartphone application processors. 802.11ac technology may provide one or more of the following technological advances, among others, over previous standards: Wider channel bandwidths (e.g., 80 MHz and 160 MHz channel bandwidths vs. 40 MHz maximum in 802.11n); more MIMO spatial streams (e.g., support for up to 8 spatial streams vs. 4 in 802.11n); multi-user MIMO, and high-density modulation (up to 256 QAM). Such advances can allow for simultaneous streaming of HD video to multiple clients throughout the home, rapid synchronization and backup of large data files, wireless display, large campus/auditorium deployments, and manufacturing floor automation, based on single-link and multi-station enhancements.

A FEM for use in a device having wireless communication functionality may comprise two or more integrated circuits, each circuit having one or more functional building blocks integrated therein and being disposed on a substrate, or die. As an example, in the context of a dual-band WiFi system, a 5 GHz power amplifier, a 2.4 GHz power amplifier, a discrete switch, and other components might be assembled onto a semiconductor die to implement the FEM system. Alternatively, two or more semiconductor die may be assembled into one FEM system, wherein the two die most likely comprise different semiconductor technologies (e.g., GaAs HBT and CMOS), wherein different technologies may each provide certain performance advantages over others. Although certain embodiments are disclosed herein in the context of 2.4 GHz and 5 GHz frequency bands, it should be understood that aspects of the present disclosure may be applicable to any suitable or feasible frequency band. For example, certain embodiments provide for integrated FEMs that operate at or near the 60 GHz radio band. Operation at higher frequencies may provide increased transmission bandwidth.

With respect to systems incorporating multiple die inside a single FEM, assembly complexity, component area, cost, package height (e.g., due to die to die bonds within the FEM, depending on the types of bonds implemented), and overall yield may be important considerations. Therefore, it may be desirable to integrate some or all of the functional building blocks of an FEM into a single semiconductor die in a manner that addresses manufacturing cost, complexity, yield, component size, and reliability issues.

Integrating multiple functional building blocks of an FEM into one semiconductor die may introduce certain complications in that some aspect of the particular semiconductor technology used may be less than optimal for one or more particular blocks. For example, an FEM utilizing a gallium-arsenide (GaAs)-based platform (e.g., GaAs HBT), which may be well suited for RF power amplification, may not have satisfactory functional characteristics for integration of low-loss, high-isolation switches. In contrast, a controller for controlling, e.g., the functional position of a switch, or which among a group of amplifier devices are enabled, might preferably, or optimally, be done in a Silicon CMOS technology platform. Generally speaking, each technology platform may import certain advantages and/or disadvantages for each building block in a given module. Moreover, it may be challenging to even identify those aspects of the semiconductor technology platform that make it less than optimal to integrate a particular building block, or blocks.

SiGe BiCMOS technology is a semiconductor technology platform that may be used to provide a platform for complete functional integration of FEM components. For example, in certain embodiments, SiGe bipolar transistor and CMOS FET technologies may be incorporated together, along with possibly other types of circuit elements, such as capacitors, resistor, interconnect metallization, etc.

One consideration that may be relevant in designing SiGe-based devices or components is the relatively low-resistivity generally associated with such substrates, which, in certain circumstances, may not provide an ideal substrate upon which to construct one or more elements of an FEM system. For example, low-resistivity substrates may interact with above-disposed technology elements to degrade the individual performance of those elements. Furthermore, in some circumstances, the low-resistivity substrate may absorb and transform RF signal energy within certain technology elements into heat or other harmonic RF signals. For example, a transmission line element above a low-resistivity substrate may be less efficient in transporting the RF signal because of loss of signal to the underlying substrate and/or dispersion effects (e.g., frequency dependent loss and phase shift). Moreover, parasitic capacitance values of the junction between the collector and substrate below and surrounding a SiGe bipolar transistor may have a dramatic impact on production of undesirable harmonic signals in connection with a desired amplified RF input signal. Likewise, a parasitic n-well-to-substrate junction used in triple-well NMOS switches may produce undesirable harmonic signals. Therefore, the identification and correlation of the impact of such parasitic substrate junctions on the production of harmonic signals, as well as the mitigation thereof using substrate engineering, may greatly affect overall performance of an FEM constructed using SiGe technology. It may therefore be desirable for integrated FEM design to address one or more of the following objectives: achieve low-loss passive matching components; achieve low NPN substrate junction capacitance (Cjs) to enhance NPN efficiency and linearity performance through effective harmonic terminating impedances; achieve low NFET Cjs to eliminate substrate loss contribution and enhance linearity by isolating and/or preventing rectification of the underlying substrate junction; and eliminate or reduce device substrate feedback through substrate isolation. As described herein, certain embodiments provide for improved performance of SiGe-based FEM's through the use of high-resistivity layers disposed underneath, adjacent to, and/or supporting one or more SiGe BiCMOS technology elements.

As discussed herein, in accordance with certain aspects of the present disclosure, higher resistivity substrates may result in device-substrate junctions that significantly suppresses the amplitude of harmonic signals. For example, higher resistivity substrates can create junctions that have wider depletion regions and therefore lower capacitance per unit area. The modulation of such capacitances with imposed signals impinging upon the device-substrate junctions can be significantly less than with conventional 'lower-resistivity' substrates. Correspondingly, less modulation of the junction capacitance can result in a system in which parasitic elements attaching to various circuit devices have increased static behavior and less overall impact on signal distortion.

Certain embodiments disclosed herein provide progressively less expensive and smaller component size WiFi FEMs, while easing design challenges and providing benefits of functional integration. Functional integration of all necessary and/or desirable building blocks of an FEM onto a single SiGe BiCMOS technology platform may feature a high-resistivity substrate and may provide solutions to one or more of the concerns outlined above. The implementation, as described below, may be done in a manner that minimizes the losses of RF signals associated with, for example, both 2.4 and 5 GHz signals within the circuits, signal dispersion, and/or parasitic junction capacitances of active technology elements. The implementation of a high-resistivity layer or substrate underneath, adjacent to, and/or supporting the active semiconductor technology elements in other technologies, such as CMOS or bipolar technologies, may provide benefits similar to those generally associated with SiGe BiCMOS technology.

As is discussed in greater detail below, certain embodiments of integrated FEMs using SiGe BiCMOS technology in combination with high-resistivity bulk substrate may simplify front-end circuit design of certain 802.11 a/b/g/n/ac WLAN devices, and may provide one or more of the following improvements over certain other solutions, some of which are described in greater detail below: Incorporating functional FEM building blocks in a single die may allow for reduced cost, substrate area, package size and height, and assembly complexity; using a single semiconductor technology platform may provide for improved adjustment of input and output impedance and corresponding matching networks for the various functional blocks in a manner that reduces design challenges; reduction in the perimeter and area parasitic junction capacitances of bipolar and MOSFET transistors may reduces the magnitude of harmonic signal generated by such junctions; reduction in the losses associated with the substrate may improve insertion losses for triple well CMOS FET switches; reduction in both magnitude and frequency dependence of the RF signal losses in the substrate may allow for more predictable RF circuits to be designed with first pass success; reduction in both magnitude and frequency dependence of RF signal phase shift may allow more predictable harmonic impedance terminations to be implemented within RF amplifiers; reduction in magnitude of parasitic junctions underlying active transistors may improve AC gain at various bias points; use of high-resistivity (HR) implant (discussed in greater detail below with respect to FIGS. 5A-5G) to introduce a high-resistivity substrate may allow for higher-Q passive components for phase shifters, oscillators, low-noise amplifiers, driver amplifiers, power amplifiers (multi-mode, multi-path, and others) and/or filters on SiGe technology; and improved intra-chip connections may permit more optimal placement of functional blocks to meet particular package pin-out designs.

FIG. 1 illustrates an embodiment of a wireless device 100 in accordance with one or more aspects of the present disclosure. Applications of the present disclosure are not limited to wireless devices and can be applied to any type of electronic device including RF front-end circuitry. The application of a high-resistivity substrate within the context of a SiGe BiCMOS process may enable various types of circuits to be realized that will benefit from the reduction of device-substrate capacitance (e.g., cable line drivers, laser drivers, etc.) and reduced second-order modulation effects such as harmonics. The wireless device 100 can include an RF module 120. In certain embodiments, the RF module 120 includes multiple signal-processing components. For example, the RF module 120 may include discrete components for amplification and/or filtering of signals in compliance with one or more wireless data transmission standards, such as GSM, WCDMA, LTE, EDGE, WiFi, etc.

The RF module 120 may include transceiver circuitry. In certain embodiments, the RF module 120 comprises a plurality of transceiver circuits, such as to accommodate operation with respect to signals conforming to one or more different wireless data communication standards. Transceiver circuitry may serve as a signal source that determines or sets a mode of operation of one or more components of the RF module 120. Alternatively, or in addition, a baseband circuit 150, or one or more other components that are capable of providing one or more signals to the RF module 120 may serve as a signal source provided to the RF module 120. In certain embodiments, the RF module 120 can include a digital to analog convertor (DAC), a user interface processor, and/or an analog to digital convertor (ADC), among possibly other things.

The RF module 120 is electrically coupled to the baseband circuit 150, which processes radio functions associated with signals received and/or transmitted by one or more antennas (e.g., 95, 195). Such functions may include, for example, signal modulation, encoding, radio frequency shifting, or other function. The baseband circuit 150 may operate in conjunction with a real-time operating system in order to accommodate timing dependant functionality. In certain embodiments, the baseband circuit 150 includes, or is connected to, a central processor. For example, the baseband circuit 150 and central processor may be combined (e.g., part of a single integrated circuit), or may be separate modules or devices.

The baseband circuit 150 is connected, either directly or indirectly, to a memory module 140, which contains one or more volatile and/or non-volatile memory/data storage, devices or media. Examples of types of storage devices that may be included in the memory module 140 include Flash memory, such as NAND Flash, DDR SDRAM, Mobile DDR SRAM, or any other suitable type of memory, including magnetic media, such as a hard disk drive. Furthermore, the amount of storage included in memory module 140 may vary based on one or more conditions, factors, or design preferences. For example, memory module 140 may contain approximately 256 MB, or any other suitable amount, such as 1 GB or more. The amount of memory included in wireless device 100 may depend on factors such as, for example, cost, physical space allocation, processing speed, etc.

The wireless device 100 includes a power management module 160. The power management module 160 includes, among possibly other things, a battery or other power source. For example, power management module may include one or more lithium-ion batteries. In addition, the power management module 160 may include a controller module for management of power flow from the power source to one or more regions of the wireless device 100. Although the power management module 160 may be described herein as including a power source in addition to a power management controller, the terms "power source" and "power management," as used herein, may refer to either power provision, power management, or both, or any other power-related device or functionality.

The wireless device 100 may include one or more audio components 170. Example components may include one or more speakers, earpieces, headset jacks, and/or other audio components. Furthermore, the audio component module 170 may include audio compression and/or decompression circuitry (i.e., "codec"). An audio codec may be included for encoding signals for transmission, storage or encryption, or for decoding for playback or editing, among possibly other things.

The wireless device 100 includes connectivity circuitry 130 comprising one or more devices for use in receipt and/or processing of data from one or more outside sources. To such end, the connectivity circuitry 130 may be connected to one or more antennas 195. For example, connectivity circuitry 130 may include one or more power amplifier devices, each of which is connected to an antenna. Antenna 195 may be used for data communication in compliance with one or more communication protocols, such as WiFi (i.e., compliant with one or more of the IEEE 802.11 family of standards) or Bluetooth, for example. Multiple antennas and/or power amplifiers may be desirable to accommodate transmission/reception of signals compliant with different wireless communications protocols. Among possibly other things, the connectivity circuitry 130 may include a Global Positioning System (GPS) receiver.

The connectivity circuitry 130 may include one or more other communication portals or devices. For example, the wireless device 100 may include physical slots, or ports, for engaging with Universal Serial Bus (USB), Mini USB, Micro USB, Secure Digital (SD), miniSD, microSD, subscriber identification module (SIM), or other types of devices through a data-communication channel.

The wireless device 100 includes one or more additional components 180. Examples of such components may include a display, such as an LCD display. The display may be a touchscreen display. Furthermore, the wireless device 100 may include a display controller, which may be separate from, or integrated with, the baseband circuit 150 and/or a separate central processor. Other example components that may be included in the wireless device 100 may include one or more cameras (e.g., cameras having 2 MP, 3.2, MP, 5 MP, or other resolution), compasses, accelerometers, or other functional devices.

The components described above in connection with FIG. 4 and wireless device 100 are provided as examples, and are non-limiting. Moreover, the various illustrated components may be combined into fewer components, or separated into additional components. For example, baseband circuit 150 can be at least partially combined with the RF module 120. As another example, the RF module 120 can be split into separate receiver and transmitter portions.

Figure 2:
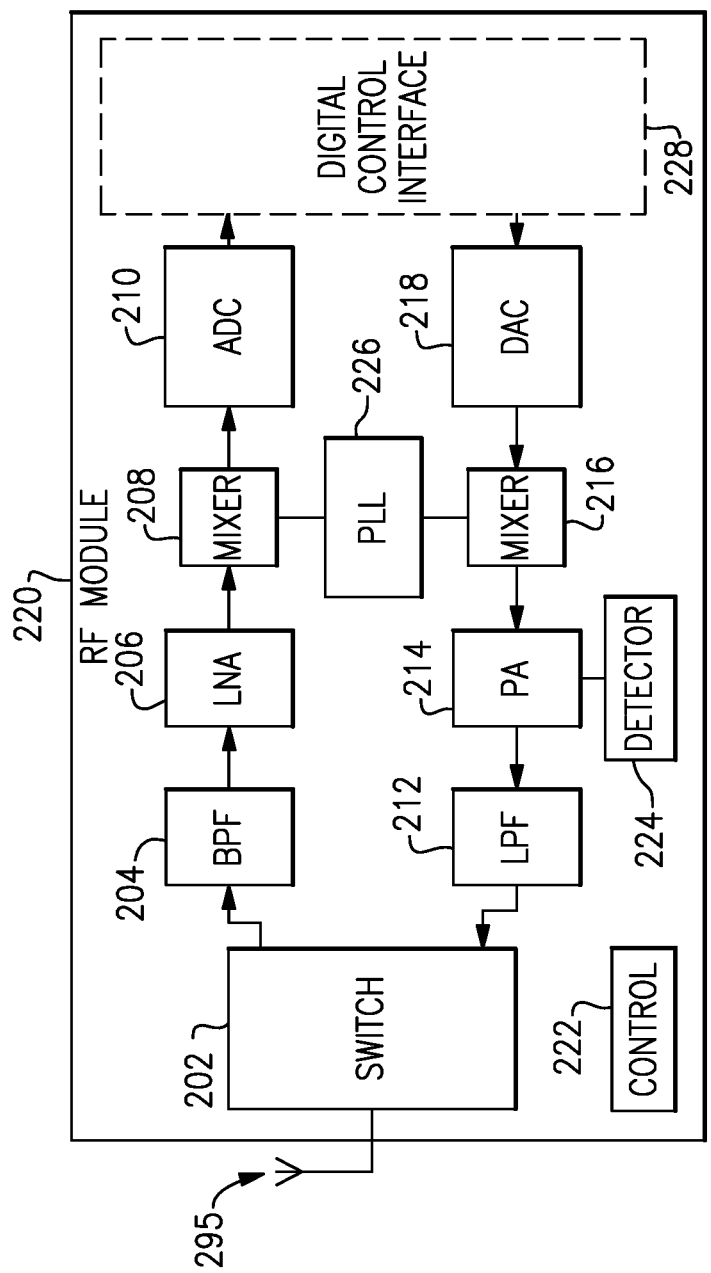
FIG. 2 illustrates an embodiment of an RF module in accordance with one or more features of the present disclosure.

FIG. 2 provides an embodiment of an RF module such as the RF module illustrated above with respect to FIG. 1. The RF module 220 includes a switch 202 which is connected to an antenna 295. The antenna 295 may receive and/or transmit wireless signals between the RF module 220 and an external source. In certain embodiments, the switch 202 is configured to select a path of propagation for a wireless signal through the switch 202. In certain embodiments, a first configuration of the switch 202 connects a path between the antenna and a receiver portion of the RF module 220. The receiver portion of the RF module may include, for example, a band-pass filter (BPF) 209, which is a device that passes frequencies within a certain range, or band, and rejects or attenuates frequencies outside that range. The BPF 209 may be configured to filter out unwanted spectrum of RF signal corresponding to a desired channel of operation. In certain embodiments, the receiver portion of the RF module includes dual-band functionality, wherein the receiver signal is divided into multiple receiver paths (not shown) corresponding to different channels of operation.

The received signal is provided from the bandpass filter to a low noise amplifier (LNA) 206, which serves to amplify the received signal. The LNA 206, which is an electronic amplifier used to amplify possibly very weak signals may be desirable in order to amplify signals captured by the antenna 295, which may be relatively weak. Although the LNA is depicted as being disposed at a point in the receiver path following the BPF 204, the LNA 206 may be disposed at any suitable position in the receiver path. The LNA 206 may be disposed following the BPF 204 in order to avoid amplification of out-of-band signals. In certain embodiments, the LNA 206 is disposed relatively close to the antenna 295 in order to reduce losses in the feedline that may otherwise reduce receiver sensitivity.

The signal may be provided from the LNA 206 to a mixer 208, and further to an analog to digital converter (ADC) 210. The mixer 208 is a nonlinear electrical circuit that converts the received RF signal to an intermediate frequency for processing by a baseband module. The mixer 208 may be configured to create new frequencies from two signals applied to it, such as the received RF signal, and a signal from a phase-locked loop (PLL) module 226, such as a signal generated by a local oscillator that operates in connection with the PLL 226. The ADC 210 may be desirable for converting the received RF signal to a digital signal for baseband processing. The digital signal may be provided by the ADC to one or more components of the wireless device via a digital control interface 228

When the switch 202 is placed in a transmit mode of operation, a path is enabled between the antenna and a transceiver portion of the RF module 220. A signal may be provided to the RF module via the digital control interface 228, such as, from a baseband processor or other module. For example, the signal may be provided to a digital to analog converter (DAC) 218, which serves to convert the received signal to an analog signal for transmission by the RF module. The converted analog signal may be passed to a mixer module 216 and further to a power amplifier module 214, which amplifies the signal to be transmitted. The power amplifier (PA) module 214 is described in further detail below with respect to FIGS. 3A and 3B. The power amplifier may be coupled to a detector which detects a signal power present in the power amplifier module. The signal to be transmitted may pass to a low pass filter (LPF) 212, which filters out noise and other undesired frequencies from the transmitted signal. In certain embodiments, the LPF 212 is disposed before the PA 214 in the transmitter path in order to avoid amplification of undesired signals. The signal is transmitted by the RF module 220 using the antenna 295.

The RF module 220 may further comprise of one or more control modules 222 for controlling the operation of the various elements of the RF module. The control module 222 may comprise control functionality, such as band-selection logic, switch control logic, and/or amplifier enablement logic.

FIG. 3 is a block diagram of an embodiment of a power amplifier (PA) module 314 that may be incorporated in the RF module 220 shown in FIG. 2, in RF module 120 in FIG. 1. The PA module 314 is illustrated as a multi-stage PA module. While the module 314 comprises two stages, power amplifier modules in accordance with one or more embodiments disclosed herein may comprise any suitable number of gain stages. Furthermore, different bands of the PA module 314 may comprise different numbers of gain stages.

To illustrate an example PA topology, 2-stage low-band and high-band PAs are shown in FIG. 3. Due to the commonality between high and low-band (such as 802.11a- and 802.11bg-band) PAs, the description herein may be focused on either high or low-band PA design; however, it will be understood that one or more features of the present disclosure can be applied to either band, or other PA design. In certain embodiments, out-of-band rejection can be achieved in the input impedance matching network (331A or 331B), and/or inter-stage matching networks (332A or 332B). In some implementations, the output matching network (333A or 333B) not only provides optimal matching impedance for in-band operation, but also provides the harmonic impedance termination that may be desired to produce optimal signal linearity.

The power amplifier module 314 may comprise a plurality of signal band paths such as for two separate channels. The power amplifier module 314 may comprise any suitable number of amplifier stages. For example, the power amplifier module, or one or more portions of the power amplifier module, may contain one or more single stage and/or multi-stage power amplifiers. The power amplifier module 314 may include one or more impedance matching networks configured to match impedances between various circuit components. For example, in an embodiment comprising a multi-stage power amplifier, impedance matching circuits may be configured to match impedances between one or more transistor stages of the power amplifier. In certain embodiments, the power amplifier module comprises an impedance matching network 331A, 331B at an input portion of the power amplifier module in order to match impedances between the power amplifier module 314 and one or more circuit elements to which the power amplifier module is coupled, as well as an output impedance matching circuit 333A, 333B. In certain embodiments, the output impedance matching network 333A, 333B is configured to match the impedance of the power amplifier module 314 with impedance shown by an antenna coupled to the power amplifier module 314.

In certain embodiments, the power amplifier module 314 comprises one or more NPN bipolar transistors amplifiers formed above a high-resistivity bulk silicon substrate. Such transistor structure and formation are discussed below with respect to FIGS. 5A-5B and 6. In some embodiments, the power amplifier module can feature a high level of integration, wherein all matching networks, out-of-band rejection filters, voltage regulators, bias circuits, logic circuits, temperature compensation, power detectors, CMOS-compatible switches, and/or diplex filters are integrated. In certain embodiments, the dual-band PA design can also feature excellent linearity that meets the requirements of the emerging dual-band 802.11ac standards.

Figure 3A:
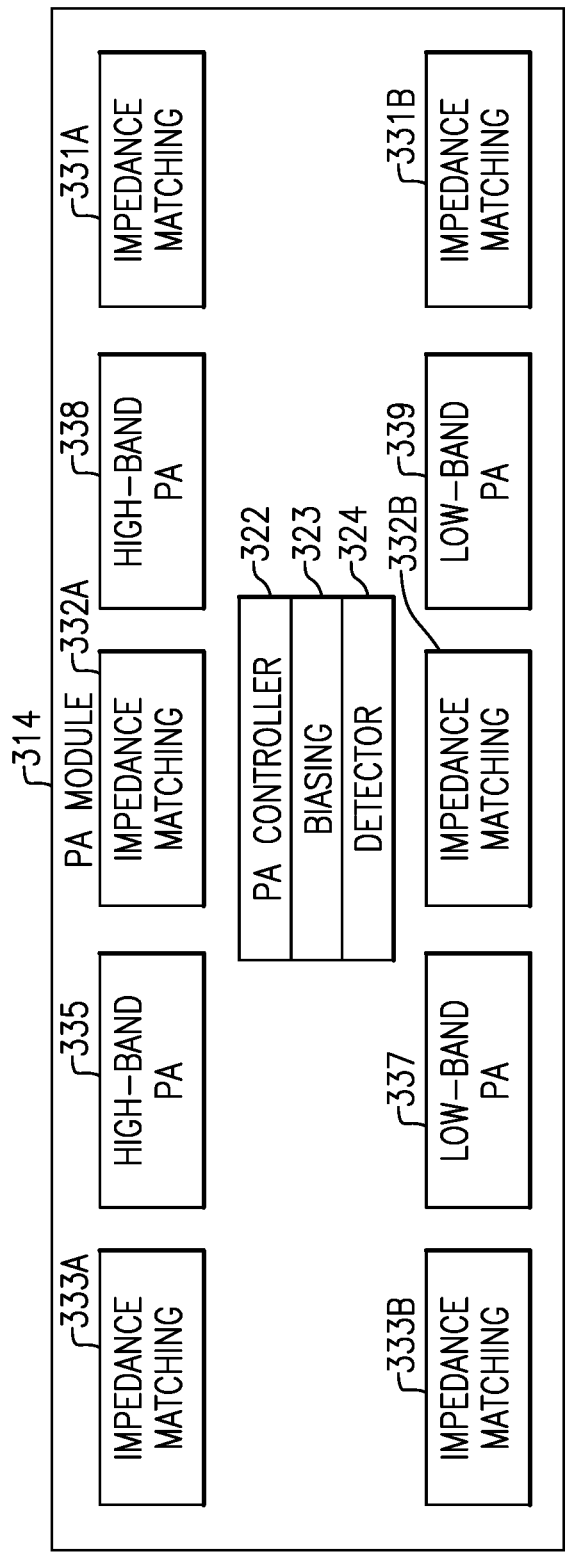
FIG. 3A illustrates a block diagram of an embodiment of a power amplifier module in accordance with one or more features of the present disclosure.
Figure 3B:
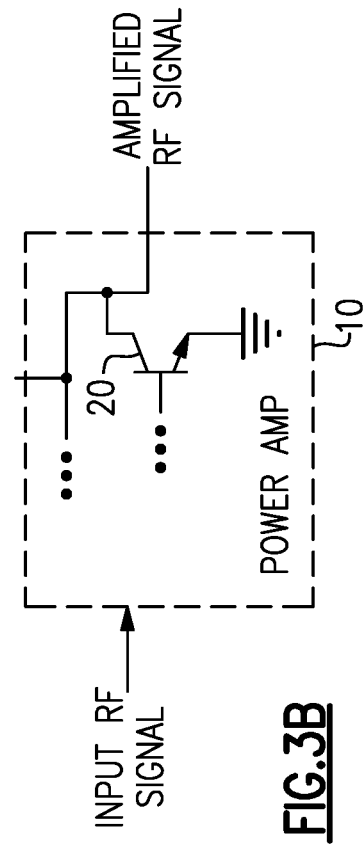
FIG. 3B illustrates a schematic diagram of an embodiment of a power amplifier in accordance with one or more features of the present disclosure.

FIG. 3B provides a schematic diagram of an individual power amplifier 10 that may be used in a power amplifier module such as that shown in FIG. 3A. The power amplifier may receive an RF signal and provide the RF signal to one or more transistor stages. In certain embodiments, the power amplifier includes a bipolar junction transistor (BJT) 20, wherein the base of the transistor receives the RF signal to be amplified. The transistor 20 may be grounded at its emitter and the voltage level provided at the base of the transistor may control current passing between a collector portion and the emitter portion. The collector may provide an output signal which corresponds to an amplified version of the input RF signal provided to the power amplifier. Various other configurations of power amplifiers may be used in accordance with embodiments disclosed herein and may include power amplifiers comprising any suitable type or configuration of transistor or transistors. As described above, the PA 10 may be one amplifier of a multi-stage power amplifier module.

In some implementations, the PA module 314 shown in FIG. 3A can have 2 stages for a bg-band PA and 3 stages for an a-band PA, and can integrate matching circuitry, out of band rejection filters, power detectors, and bias controls in a compact sized (e.g., 1.5×1.6 mm) chip. In certain embodiments, the bg-band PA can achieve approximately 28 dB gain with approximately 2% EVM at 18 dBm and approximately 3% at 19.5 dBm output power. The a-band PA may be configured to achieve approximately 32 dB gain with approximately 2% EVM at 18 dBm and approximately 3% EVM at 19 dBm output power. Such an embodiment would meet not only the regulatory out-of-band emission requirements, but also the linearity requirement of the emerging 256 QAM 802.11ac standard. The error vector magnitude (EVM) of an 802.11ac device is −32 dB at the highest data rate, which is 7 dB lower than those for 802.11g devices. Therefore, the linearity requirements for 802.11ac power amplifiers are significantly increased compared to those for conventional 802.11 applications.

The PA module 314 may include a power amplifier controller 332 for controlling one or more power amplifiers. Although not limited as such, controlling power amplifiers generally refers to setting, modifying, or adjusting the amount of power amplification provided by the power amplifier. The PA module 314 may be a single integrated component that includes the functionality of a power amplifier controller and one or more power amplifiers. In other implementations, the wireless device 100 may include separate power amplifier control circuitry and power amplifier(s).

Typically, GaAs-based PA linearity can suffer in dynamic mode operation due to the poor thermal characteristics of the GaAs substrate. GaAs PA designs may need external circuits to improve dynamic mode linearity. In certain embodiments, more advanced bias circuitry can be implemented to resolve thermal differences between PA stages, which can result in reduced or no degradation in both linearity and gain under dynamic mode operation, while reducing the overall current requirements to operate with low EVM floors as required for 802.11ac operation. Furthermore, various other technologies may be implemented to address issues associated with GaAs designs.

A PA design can be based on silicon germanium (SiGe) BiCMOS technology, which may use, or leverage, a low impedance path to ground with through silicon vias. In certain embodiments, such a design can fit in an area of approximately 1.6×1.5 mm$^2$. SiGe BiCMOS is a proven technology for bg-band PA design. However, there may be certain design challenges associated with realizing an amplifier with high gain and linearity at 6 GHz in SiGe technology. A challenge of producing high power at high frequency with acceptable linearity is that efficiency trends inversely with frequency due to increasing substrate losses and parasitic loading from low-resistivity silicon substrates.

Figure 4:
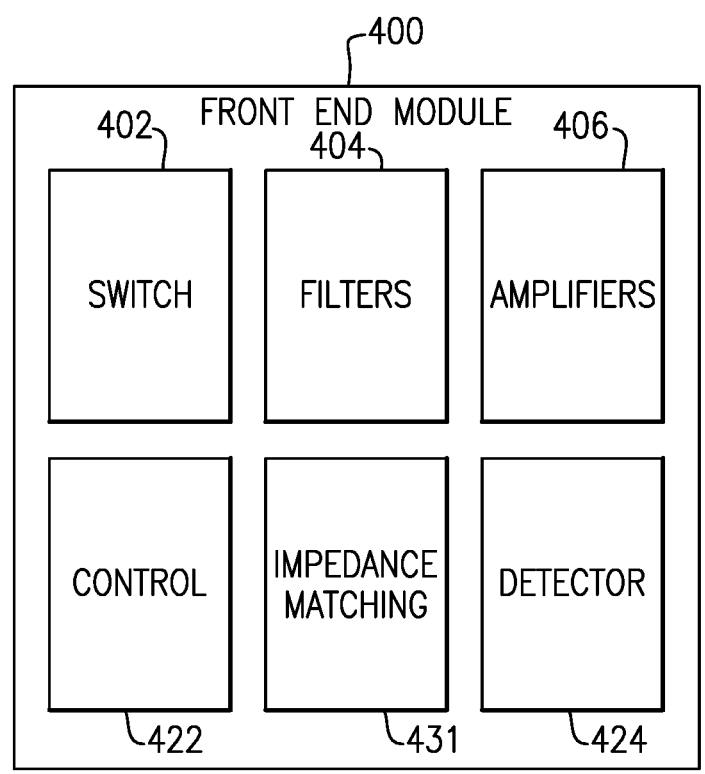
FIG. 4 illustrates a block diagram of a front-end module in accordance with one or more features of the present disclosure.

As discussed above, certain conventional FEMs are configured to operate using external switches and/or diplex filters, LNAs, and PAs, wherein one or more components are separate/independent. In certain embodiments, an FEM comprises a single module, or single chip that would have all or some of these functions integrated. FIG. 4 illustrates a block diagram of a front-end module (FEM) 400 in accordance with one or more embodiments disclosed herein. The FEM 400 may include at least a portion of the functional elements shown in FIG. 2, and described above. In certain embodiments, the FEM 400 provides some or all of the circuitry positioned between an antenna and a first intermediate frequency stage of a wireless device. For example, the FEM 400 may comprise some or all of the components in a receiver that process a signal at an original incoming radio frequency before it is converted to lower intermediate frequency. A front-end module in accordance with embodiments disclosed herein may comprise any suitable number or configuration of functional elements. Descriptions of front-end modules herein may, for convenience or otherwise, include one or more elements or modules that are unnecessary or otherwise undesirable in certain configurations. Furthermore, various descriptions herein may omit one or more functional devices or modules that may be desirable in a particular configuration. Therefore, it should be understood that descriptions of FEMs are not limiting as described herein with respect to the number and or configuration of elements shown and/or described.

FIG. 4 includes a switch 402, one or more filters 404, one or more amplifiers 406, control circuitry 422, impedance matching circuitry 431, and/or one or more detectors or sensors 424. The switch may be any suitable switch, such as, for example, SP2T, SP3T, SP4T, or other type of switch. The FEM 400 may be configured to serve as a transceiver, that is, a module providing processing circuitry for one or more receiver and/or transmitter components of a wireless device. The filters 404, for example, may be frequency selective filters, such as low-pass filters, high-pass filters, or band-pass filters, diplex filters, and may be used to isolate one or more frequencies for transmission or processing. The FEM 400 may further include one or more amplifiers 406, such as low noise amplifiers and/or power amplifiers. In certain embodiments, a receiver branch of the FEM 400 is associated with an LNA, while a transmitter branch of the FEM 400 is associated with a PA. In certain embodiments, the FEM 400 illustrated in FIG. 4 is integrated such that the disclosed components are combined on a single die. For example, all or substantially all of the components or functional elements of the FEM 400 may be disposed on a single substrate, such as a silicon-based substrate. Integration of the various components of the FEM 400 may provide certain benefits, such as increased simplicity of design, reduced cost of manufacture, reduced size or profile, and/or other benefits.

In certain embodiments, various components of the FEM 400 are contained in multiple separate chips, or dies, as opposed to being fully integrated. For example, for certain high-power applications, it may be desirable to integrate some or all of the passive components of the FEM 400 into a separate chip, or Integrated Passive Device (IPD). Use of an IPD may be desirable for cost, complexity, performance, and/or other reasons. Such embodiments may include three separate dies, a first incorporating one or more power amplifiers, a second incorporating an IPD, and a third incorporating a switch and/or LNA.

Certain embodiments comprise ICs manufactured using silicon-on-insulator (SOI) technology. Silicon on insulator (SOI) technology refers to the use of a layered silicon-insulator-silicon substrate in place of conventional silicon substrates in semiconductor manufacturing to provide device isolation and reduce parasitic device capacitance, thereby possibly improving circuit performance. SOI-based devices differ from conventional bulk silicon-built devices in that the silicon junction is formed above and surrounded by an electrical insulator, such as silicon dioxide. In certain embodiments of SOI applications, the base substrate is a high-resistivity (e.g., approximately 1 kOhm*cm) substrate. The base substrate may have a relatively thin oxide layer disposed above it, above which another layer of silicon is disposed. Devices built on the upper silicon layer can be essentially isolated electrically and thermally from the bulk substrate and from one another. The insulating layer and top-most silicon layer may vary widely with application. SOI-based technologies may provide one or more of the following benefits relative to bulk CMOS processing: SOI CMOS built on silicon dioxide, compared with CMOS built on a bulk Si substrate, may require less-complicated well structures; latchup effects inherent in bulk CMOS circuits may be reduced or eliminated due to greater isolation of the n- and p-well structures; junction capacitance associated with source and drain regions can be significantly reduced due to the relatively thin doped Si body or well; parasitic junction capacitance beneath the source and drain regions can be significantly reduced or eliminated with the insulating oxide layer, which improves power consumption at matched performance; improvement CMOS in radiation-damage toleration may be achieved due to the relatively small volume of Si available for electron-hole pair generation by radiation.

In certain embodiments, an FEM may include an LNA and switch on a silicon-on-insulator (SOI)-type die. SOI technology may be desirable in that an SOI die provides a relatively high-resistivity substrate, and therefore, passive devices may facilitate high Q and low loss characteristics. Bipolar devices, which are well-suited for SOI-based manufacturing, are often used for LNA construction based on current/noise performance of bipolar devices. However, SOI implementation may comprise increased substrate cost compared to bulk silicon technologies. Furthermore, with respect to power amplifiers formed using SOI technology, such designs may not allow for adequate thermal dissipation characteristics.

In certain embodiments, the components of FEM 400, shown in FIG. 4, are integrated on a single die using silicon-germanium (SiGe) technology. SiGe can be used for heterojunction bipolar transistors, among other things, and may provide particular benefits in mixed-signal circuit and analog circuit IC applications. SiGe is manufactured on silicon wafers using conventional silicon processing toolsets. SiGe processes may achieve costs similar to those of silicon CMOS manufacturing, and may be lower than those of certain other heterojunction technologies, such as gallium arsenide (GaAs).

Figure 5A:
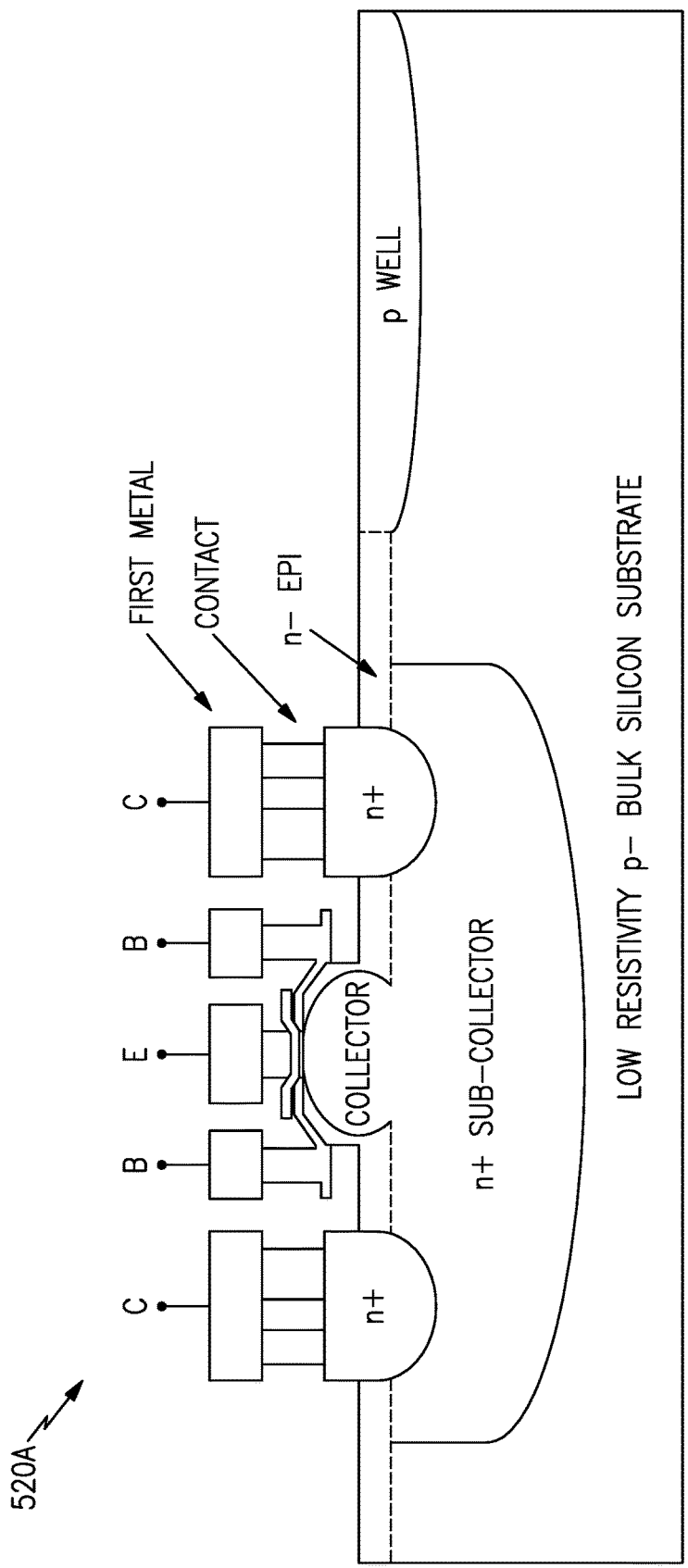
FIG. 5A illustrates a cross-sectional view of an embodiment of a bipolar transistor formed on low-resistivity bulk silicon substrate in accordance with one or more features of the present disclosure.

FIG. 5A illustrates a cross-sectional view of an embodiment of a bipolar transistor 520A formed on low-resistivity bulk silicon substrate. The transistor 520A may be formed using SiGe/Si technology, and may be an NPN, PNP, or other type of transistor. The low-resistivity nature of the silicon substrate, as discussed above, may make such a device unsuitable or undesirable for certain RF applications.

Although SiGe technologies have generally been built using low-resistivity bulk substrate, as described above, this low-resistivity may result in certain disadvantages that may make full FEM integration less feasible or desirable. For example, with low-resistivity, there is often feedback due to poor isolation between devices integrated on the silicon surface. Unwanted signals from one device can travel through the low-resistivity substrate to adversely affect the performance of other devices processing other signals. In certain embodiments, effects of low-resistivity substrate are attenuated or avoided by building SiGe devices on, or adjacent to, high-resistivity substrate instead. Such techniques can allow for similar design approaches to those implemented in GaAs-based technologies. As silicon wafers are often less expensive than GaAs wafers, among other advantages, using SiGe technology may provide cost benefits.

Figure 5B:
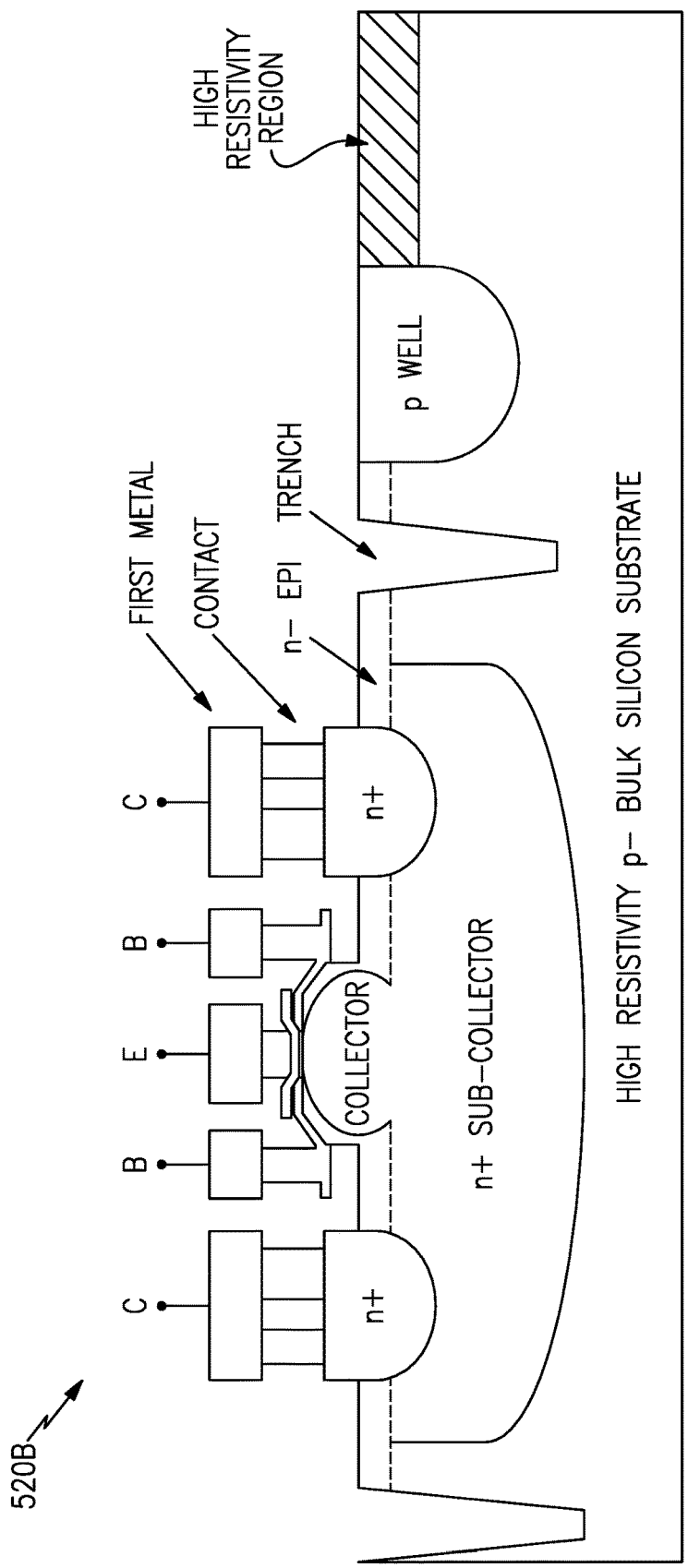
FIG. 5B illustrates a cross-sectional view of a bipolar transistor formed on high-resistivity bulk silicon substrate in accordance with one or more features of the present disclosure.

FIG. 5B illustrates a cross-sectional view of an embodiment of a bipolar transistor 520B formed on high-resistivity bulk silicon substrate. The transistor 520B may be formed using SiGe/Si technology, and may be an NPN, PNP, or other type of transistor. Use of SiGe/Si technology may allow for formation of transistors having faster operation than traditional Si transistors. In certain embodiments, the device of FIG. 5B includes a layer of high-resistivity bulk substrate, such as silicon having resistivity characteristics greater than 50 Ohm*cm. In certain embodiments, the bulk substrate is a high-resistivity p-type silicon. The high-resistivity layer may have resistivity of around 1000 Ohm*cm, for example. As shown in FIG. 5B, the transistor 520B includes an n+ type sub-collector region, which may comprise, for example, heavy Arsenic implant. However, the sub-collector, and/or other portions of the transistor 520B may comprise various types/materials, depending on the technology utilized.

In certain device manufacturing processes, an epitaxial layer of low-resistivity substrate (e.g., n-type epitaxial layer ("n– epi")) may be formed near a top surface of the bulk silicon substrate. For example, during processing, Arsenic, or other material from the implanted sub-collector regions may out-diffuse and redeposit on the surface of the silicon substrate, forming the low-resistivity layer. In certain embodiments, the n– epi layer may have a resistivity of around 1-100 Ohm*cm and may be approximately 1 m in thickness. Additionally, the application of silicon dioxide on the surface of high resistivity silicon substrates, as may be used in SiGe/Si device manufacturing processes, may introduce fixed charges which attract free carriers and further decreases the bulk resistivity near the surface. Formation of such a layer at the surface may be undesirable, as its low-resistivity nature may result in unwanted parasitic current conduction leading to leakage, cross talk, high frequency losses, and susceptibility to external electric fields that induce non-linearity and harmonic distortion.

In order to at least partially alleviate potential concerns introduced by the low-resistivity layer, the wafer may be treated with a substance that at least partially damages or alters the structure of the low-resistivity layer. For example, in certain embodiments, Argon gas may be implanted in the wafer to at least partially destroy the silicon lattice in that region. Argon, being a noble gas, is inert and therefore does not react chemically with the silicon, or other material. It may not be desirable to implant lattice destroying agent and in close proximity to an active device, or any device that relies on single-crystal substrate. Therefore, in certain embodiments, the treatment of the wafer with lattice destroying agent (i.e., high-resistivity implant) is done selectively in regions at least a predetermined distance away from an active device, such as a bipolar transistor. For example, the high-resistivity implant may be implanted at least one micrometer distance from devices that would be adversely affected by the implant. In certain embodiments, the high-resistivity implant is implanted at least 10 µm from an active device. In certain embodiments, the high-resistivity implant is implanted 5-10 µm from an active device.

Various other methods of addressing parasitic conduction issues associated with low-resistivity may be used in place of, or in addition to, the high-resistivity implant discussed above. For example, in certain embodiments, the wafer may be treated with a layer of polysilicon or amorphous silicon prior to oxide application (i.e., a "trap-rich" layer), which is configured to lock the free carriers up, thereby inhibiting mobility at operating frequencies. Such a method may be suitable for SOI applications, and may be capable of withstanding high temperature conditions needed for CMOS processing. In addition, any other suitable or desirable mechanism for restoring high-resistivity characteristics of the wafer may advantageously be utilized in connection with embodiments disclosed herein. Furthermore, one or more trenches, as shown, may be etched into the wafer, thereby impeding the movement of carriers in the substrate across the trench(es).

Although high-resistivity substrate may be conducive to desirable bipolar transistor construction, it may be desirable for certain devices, such as CMOS, to be associated with low-resistivity substrate. Therefore, in certain embodiments, one or more devices, such as CMOS FET devices and/or SiGe bipolar HBT devices, are grown on a bulk silicon substrate. Due to undesirable effects of high-resistivity substrate on certain devices, low-resistivity substrate (e.g., p-type implant ("p well")) may be implanted beneath, or adjacent to, such devices. Therefore, the transistor 520 may benefit from low resistivity p-well diffusion and contact to the substrate, as well as a surrounding high-resistivity region (discussed in greater detail below). The p well may comprise a band that at least partially surrounds the collector of the transistor 520B, or may be a local diffusion area close to the collector. Although certain embodiments of transistors and substrates are described herein in the context of NPN, NFET, or other impurity-type devices, it should be understood that any of the embodiments disclosed herein may comprise n-type or p-type collector, well, and bulk substrates. As a p-well band, there may be one or more certain critical distances from the n-well that minimizes or substantially reduces NPN collector-junction capacitance and harmonic generation. In certain embodiments, without a band of p-well, the collector n-well would not be adequately isolated from the n-epi layer that is grown on top of the high resistivity substrate unless the isolation is achieved by rendering the n-epi layer to high resistivity by some implant or counter doping or deep trench.

In certain embodiments, a pocket of charge may collect in a region between the trench and p well shown in FIG. 5B. Therefore, it may be desirable for the trench to be disposed immediately adjacent to the p well in order to avoid such charge collection. In certain embodiments, a high-resistivity device such as that shown in FIG. 5B does not comprise a trench between the sub-collector region and p well. The p well may serve to set up or limit the width of a depletion region, thereby increasing capacitance at the n well/p well junction. The embodiment depicted in FIG. 5B includes a high-resistivity implant region disposed adjacent to the p well.

In certain embodiments, the p well may be disposed between the transistor 520B and one or more passive or active devices disposed on the substrate. Therefore, the p well may provide at least partial electrical isolation between the transistor 520B and such devices.

Figure 5C:
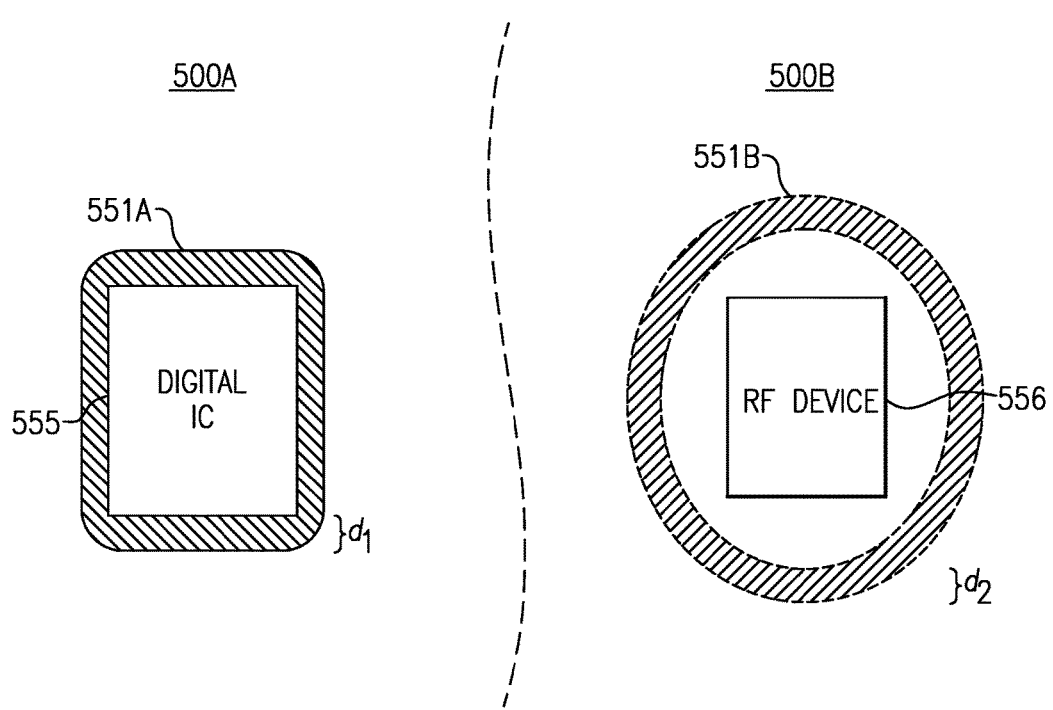
FIG. 5C illustrates an embodiment of a substrate having a plurality of electronic devices disposed thereon in accordance with one or more features of the present disclosure.

FIG. 5C illustrates an overhead view of a substrate with a plurality of electronic devices disposed thereon. As shown in FIG. 5C, low-resistivity p-type implant 551A may be disposed beneath a digital IC or collection of devices 555 to reduce interference. In certain embodiments, however, some devices, such as SiGe bipolar devices, do not have low-resistivity implant disposed beneath them. For example, one or more triple-well isolated NMOS devices for RF switches and/or one or more bipolar SiGe transistors for power amplifiers do not receive low-resistivity implant beneath, but may receive low-resistivity implant 551B disposed around a perimeter of the device. Therefore, a single wafer, or die, can incorporate both high and low-resistivity substrate regions. Integration of FEM components may allow for the elimination of wire bonds, which may contribute to improved performance and/or reduced size of the device.

As shown in FIG. 5C, a first portion of the substrate 500A includes a digital IC 555. For example, the IC 555 may be associated with any non-RF device, such as a controller, digital I/O, ADC, DAC, etc. The device 555 is disposed above a low-resistivity implant 551A. Whereas the low-resistivity implant 551A is disposed adjacent to the device 555, substrate surrounding, or beneath the low-resistivity implant 551 may have high-resistivity characteristics, as described above. It may be desirable to form the device 555 on such a low-resistivity region in order to achieve certain beneficial characteristics that a low-resistivity substrate may provide with respect to various types of devices. For example, the low-resistivity implant may provide for effective contact between the device and the substrate and help draw out free carriers that may be injected into the substrate as a result of operation of the device. Low-resistivity implant 551A may extend a distance $d_1$ beyond the footprint of the device 555.

Low-resistivity implant disposed too closely to an active device may lead to various issues, such as undesirable capacitive coupling between the device and the low-resistivity region. For example, when low-resistivity substrate is too close to an active device, a junction capacitance may be formed between an n-type layer of the device and a p-type low-resistivity implant. Such issues may at least partially defeat the purpose of utilizing high-resistivity substrate to begin with. Therefore, in certain embodiments, an RF device 556 is disposed above and immediately adjacent to high-resistivity substrate 501B.

In order to achieve some of the benefits associated with low-resistivity, a low-resistivity implant 551B may be implanted in the vicinity of, though not too close to, the device 556. In certain embodiments, in order to avoid undesirable coupling or other results, the low-resistivity implant 551 does not encroach within a predetermined distance of the device, or within a predetermined distance of a buried layer of the device. With respect to various regions of the device 556, the distance between the device and the low-resistivity layer 551B may be greater than approximately one micrometer. Certain embodiments disclosed herein may provide for at least partially optimized placement of low-resistivity implant. For example, in certain embodiments, low-resistivity implant 551B is disposed at a distance far enough from the device 556 to avoid substantial coupling (e.g., 1 μm away), but close enough to make efficient use of space (e.g., within 10-15 μm of the device).

FIG. 5C shows the low-resistivity layer 551B in the form of an elliptical region surrounding at least a portion of the device 556. Although shown as an ellipse, the region 551B may be of any suitable or desirable shape or size, such as a rectangular region about a rectangular device, as in the embodiment shown in FIG. 5D. The low-resistivity region 551B may have a particular width $d_2$ with respect to a radial axis of the device 556.

Figure 5D:
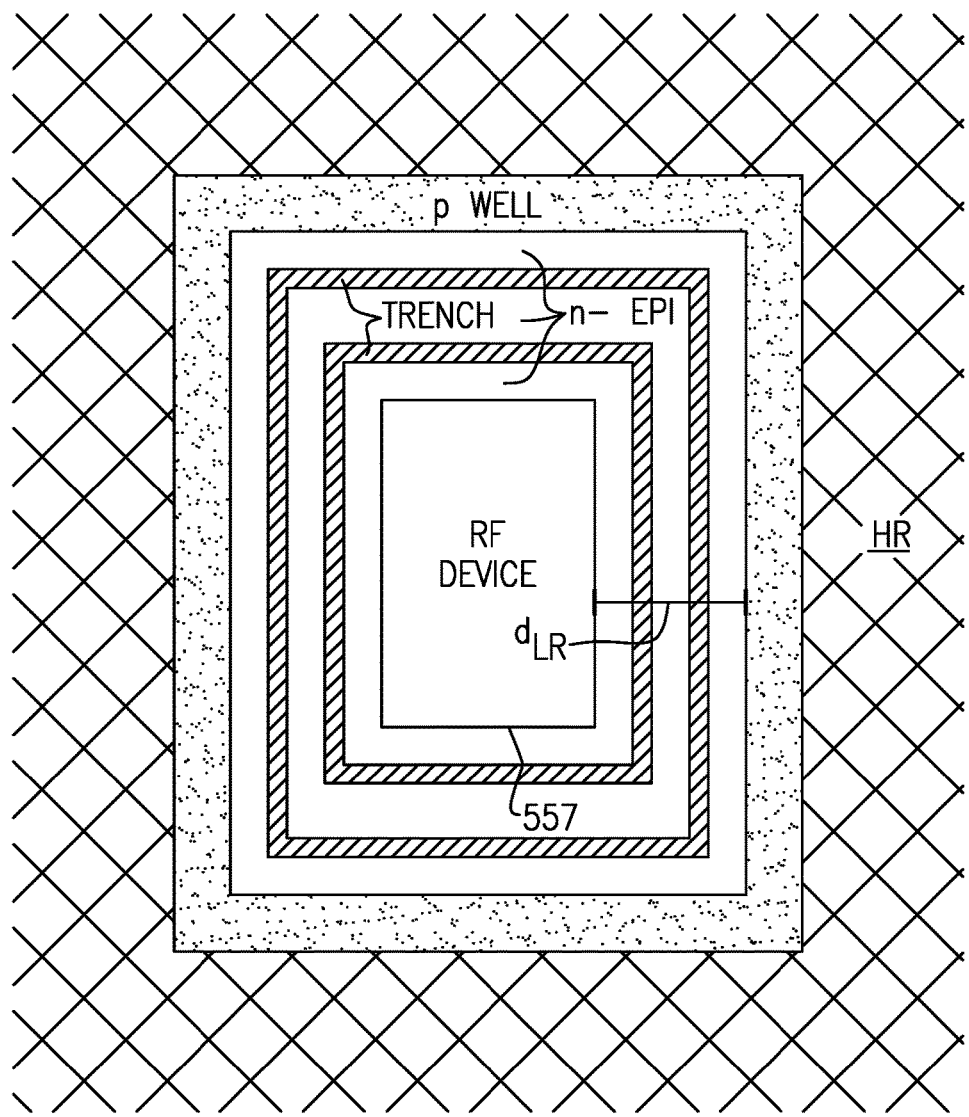
FIG. 5D illustrates an embodiment of a substrate having an electronic device disposed thereon in accordance with one or more features of the present disclosure.

FIG. 5D illustrates an overhead view of an RF device disposed on a substrate. The RF device 557 may be, for example, an NPN transistor, such as that shown in FIG. 5B. In certain embodiments, an RF device 557 is surrounded by a low-resistivity region, or well, such as a p type low-resistivity substrate ("p well"). The low-resistivity region ("HR") may comprise a deep well. The low-resistivity region may be utilized in order to limit depletion into the adjacent high-resistivity implant region do to the presence of positive voltage potential between a sub-collector of the RF device 557 and the underlying bulk substrate.

As described above, it may be desirable in embodiments utilizing a low-resistivity region (e.g., p well) such as that shown in FIG. 5D to configure the low-resistivity region such that it does not come too close to the RF device 557. Therefore, in certain embodiments, the low-resistivity region is disposed at least a distance $d_{LR}$ from the RF device 557. For example, it may be desirable for the low-resistivity region to be disposed at least 1 μm, 3 μm, 5 μm, or 10 μm away from an outside perimeter of the RF device 557. The distance $d_{LR}$ may be optimized to reduce junction capacitance of various PN junctions. As the capacitance of PN junctions is voltage dependent, it may be important that the distance $d_{LR}$ be configured such that parasitic capacitance is reduced or minimized.

The space between the RF device and the low-resistivity region may be inhabited at an upper surface of the substrate by a low-resistivity epitaxial layer, as described above in connection with FIG. 5B. In certain embodiments, one or more trenches are formed between the RF device and the low-resistivity implant. For example, as shown in FIG. 5D, two trenches may surround the RF device 557. Such trenches may be formed in some manner, and may be useful in reducing the junction capacitance and limiting width of depletion region from the device 557. A trench in accordance embodiments disclosed herein may be of any suitable or desirable depth. For example, a trench may be a deep trench, extending to or below a depth of a sub-collector of the device 557. Outside of the low-resistivity substrate region, as described above, it may be desirable to introduce a lattice-destroying implant, or other structure altering process, in order to destroy an upper low-resistivity layer, such as n-epitaxial or free carrier region formed at or near the substrate surface, thereby restoring high-resistivity characteristics to the region (identified as "HR" in FIG. 5D). The HR region may be selectively implanted in various regions in order to improve operation of RF and non-RF devices.

Passive elements, such as resistors, capacitors, inductors, and transmission lines, may be disposed directly above high-resistivity regions. Although such high-resistivity regions, as described above, comprise substrate in which an upper layer of the crystal lattice has been destroyed, such passive components do not require such upper lattice, and may experience improved high frequency performance in the presence of the high-resistivity region.

Figure 5E:
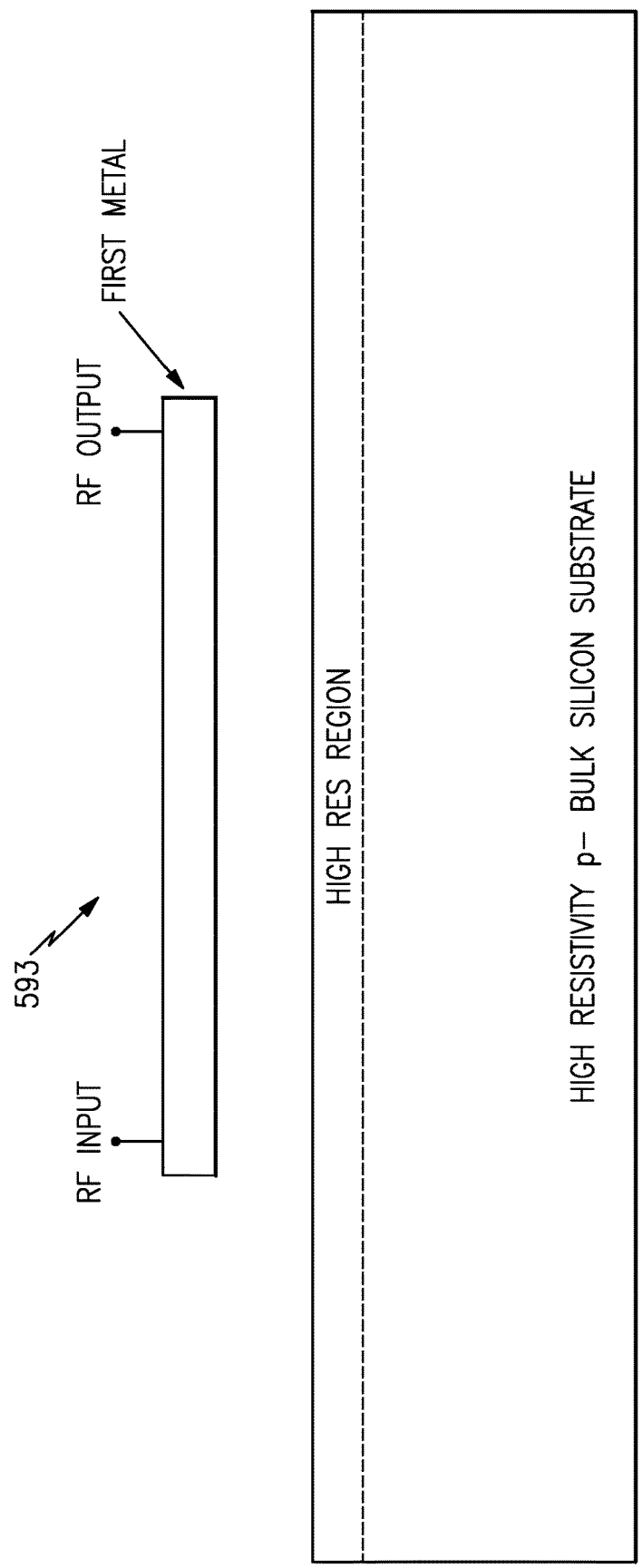
FIG. 5E illustrates a cross-sectional view of a transmission line disposed above a high-resistivity substrate in accordance with one or more features of the present disclosure.

FIG. 5E illustrates a cross section of a transmission line disposed above a high-resistivity region of a substrate. The high-resistivity region may be formed, for example, by treating a top layer of the silicon substrate with a lattice-destroying agent, such as Argon or another noble gas. The high-resistivity region may help to isolate the transmission line 593 from surrounding devices, reduce high frequency losses, and suppress the amplitude of generated harmonic signals from the otherwise underlying free carriers that are attracted to the surface from fixed charges present in the silicon dioxide dielectric layer. Passive devices, such as transmission line 593 may be present on a single bulk silicon high-resistivity substrate with active RF devices, such as power amplifier bipolar transistors, wherein the high-resistivity region, or implant, is disposed in proximity to, but does not encroach upon, or impede performance of, the transistor, as shown in FIG. 5C.

Figure 5F:
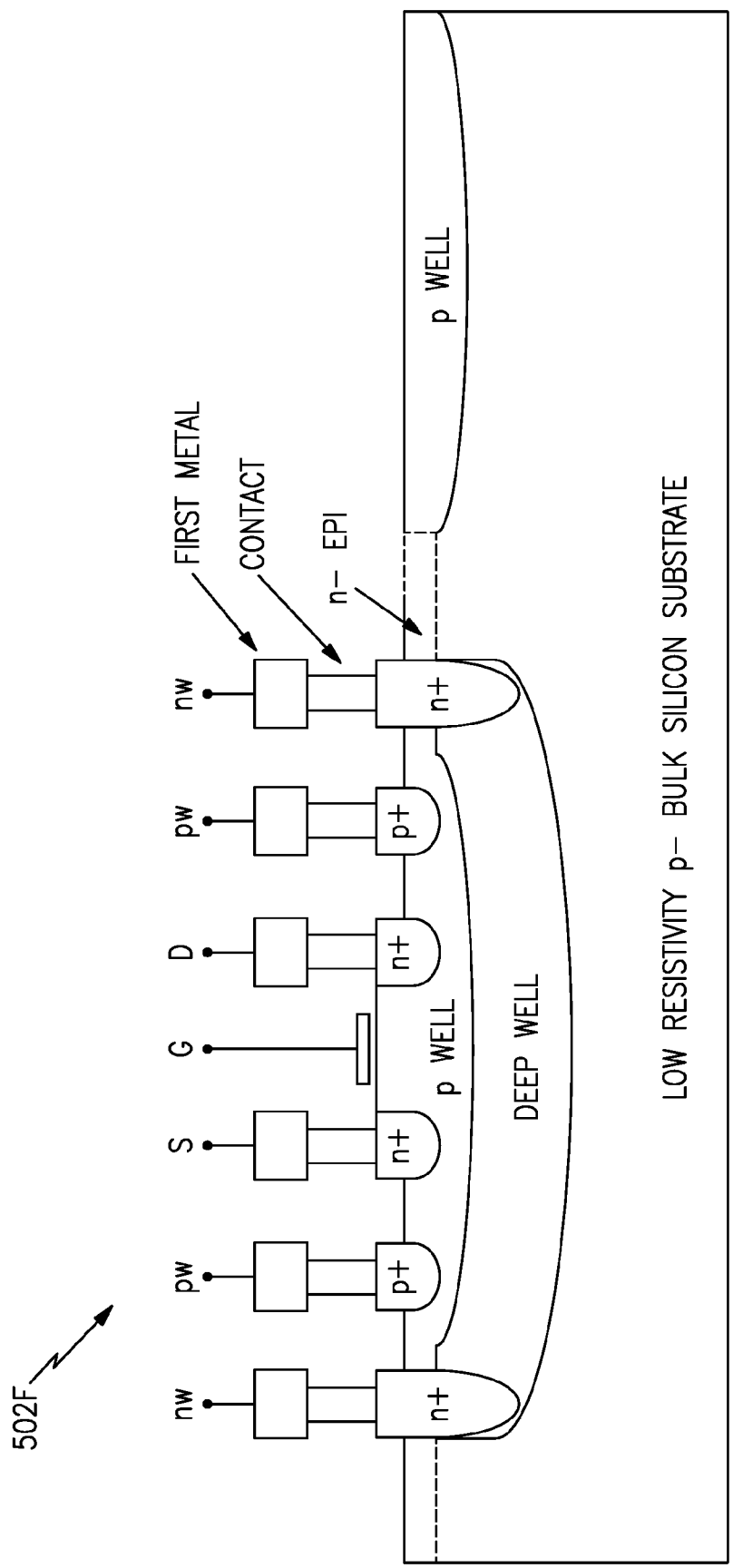
FIG. 5F illustrates a cross-sectional view of a FET transistor formed on low-resistivity bulk silicon substrate in accordance with one or more features of the present disclosure.

FIG. 5F illustrates a cross-sectional view of an embodiment of a FET transistor 502F formed on low-resistivity bulk silicon substrate. The transistor 502F may be formed using SiGe/Si technology, and may be a triple-well NFET, or other type of transistor. The low-resistivity nature of the silicon substrate, as discussed above, may make such a device unsuitable or undesirable for certain RF applications.

Figure 5G:
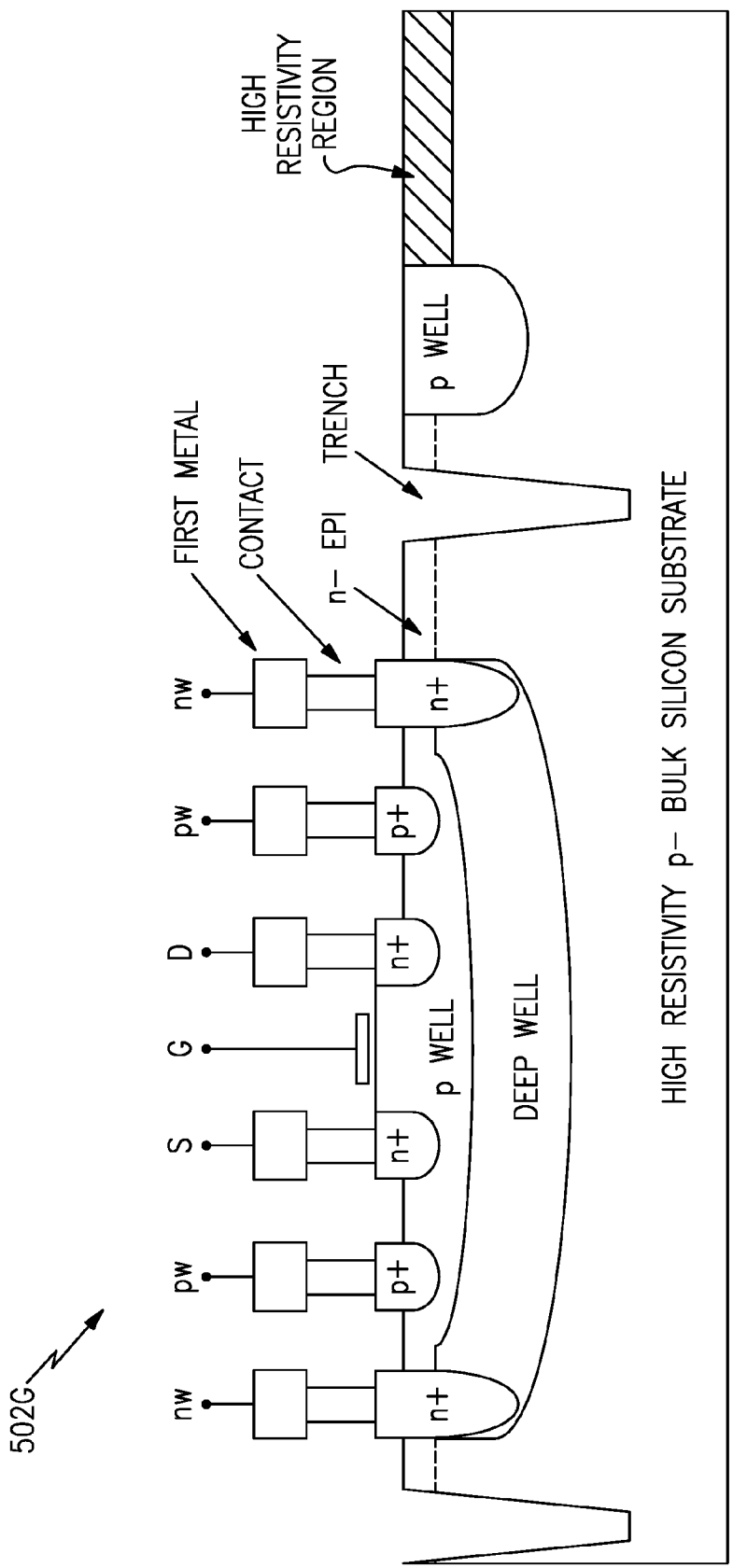
FIG. 5G illustrates a cross-sectional view of a FET transistor formed on high-resistivity bulk silicon substrate in accordance with one or more features of the present disclosure.

FIG. 5G illustrates a cross-sectional view of an embodiment of a FET transistor 502G formed on high-resistivity bulk silicon substrate. The transistor 502G may be formed using SiGe/Si technology, and may be a triple-well NFET, or other type of transistor. Similarly to the bipolar device described above with reference to FIG. 5B, the transistor 502G may be disposed adjacent to, or surrounded by, a low-resistivity region, or well, such as a p-type well ("p well"). The p well may be a deep well, and may assist in limiting depletion regions associated with n-type junctions of the transistor 502G. Outside the p well, there may be a high-resistivity region, such as a region formed by ion implantation of Argon on a top surface of the substrate to at least partially destroy low-resistivity epitaxial region or accumulation of free charges formed at or near the top surface of the high-resistivity bulk substrate.

With a low resistivity substrate p-well diffusion and contact provided a certain distance from the device 502G, and a surrounding high resistivity region that has been rendered high resistivity by some implant or counter doping or deep trench, the transistor 502G may achieve substantial electrical isolation from neighboring devices. For example, the substrate may have disposed thereon one or more other passive or active devices, wherein the p well is disposed at least partially between the transistor 502G and such devices. With respect to other passive devices (e.g., inductors fashioned in the metal layers subsequent to the formation of the FET device), such devices may have higher performance as a result of being disposed directly above the high resistivity region, wherein the high-resistivity region has been rendered high resistivity by high-resistivity implant or counter doping or utilization of one or more deep trenches. The transistor device 502G may be part of an RF switch circuit, or may form part of a mixer circuit or low noise amplifier circuit, or other circuit module.

The RF devices formed on high-resistivity bulk substrate, as disclosed herein, may be formed using traditional silicon technologies, or may be formed using SiGe/Si BiCMOS technology. One advantage of SiGe BiCMOS technology is relatively easy integration of RF core and analog circuits. In certain embodiments, RF core components may be based on SiGe transistors and analog components, such as bias circuits, power amplifiers, low noise amplifiers, RF switches, and power detectors. By allowing for integration of CMOS logic with heterojunction bipolar transistors, SiGe can be particularly suitable for mixed-signal circuits. Heterojunction bipolar transistors have higher forward gain and lower reverse gain than traditional homojunction bipolar transistors. This translates into better low-current and high-frequency performance. Being a heterojunction technology with an adjustable band gap, SiGe may provide more flexible band gap tuning than silicon-only technology.

Power amplifiers may have improved thermal characteristics in SiGe-based applications when compared to SOI-based applications. For example, in SOI-based applications, the insulator that exists between the silicon and the active device may have low thermal conductivity, at least partially preventing dissipation of heat generated by the PA device. A SiGe-based transistor may be built on the semi-insulating substrate, allowing heat to be removed via the substrate, as in other silicon-based applications. Furthermore, by providing the ability to integrate CMOS and bipolar technologies, SiGe applications may provide improved linearity.

SiGe applications may be built on high-resistivity bulk silicon substrate having n-type diffusions. Higher resistivity may improve the transistor-level performance, and allow for integration of, for example, high-Q passive components, filters, switches, and amplifiers on a single chip. Performance of passive components associated with an FEM built on high-resistivity substrate may depend largely on the type of back-end metals used in connection with the substrate.

As discussed above, traditional SiGe technology incorporates bulk silicon having relatively low resistivity, such as around 10-50 Ohm*cm. Certain preferred embodiments described herein, conversely, involve providing a high-resistivity substrate on which transistors and/or other devices are built using a modified or identical process flow. Integration of an FEM using high-resistivity BiCMOS SiGe technology may provide certain advantages over other technologies, such as the ability to integrate both the switch and the PA transistors into the bulk substrate. For example, transistor junction capacitance (Cjs) may be substantially reduced, such as by a factor of 10 or more, in high-resistivity applications. In addition, the Cjs series resistive component associated with the bulk substrate may be increased by up to 10-100 times or more compared to that obtained with low resistivity substrate. As a result, power loss may be substantially reduced. Low parasitic contribution from the bulk substrate may provide, among other things, improved RF isolation between neighboring circuits and/or neighboring devices, and lower losses due to the underlying low-loss silicon region. Low parasitic contribution from the bulk will further alleviate the otherwise constrained impedance tuning necessary to optimally match power amplifier stages harmonic frequencies for linear or saturated power amplifier applications.

Various challenges can arise when converting the underlying substrate from low to high resistivity. For example, when the bulk substrate resistivity is changed, depletion widths associated with active components disposed on n-type diffusions tend to be larger than in low-resistivity substrates. Such increase in depletion width may be significant, such as by one or more orders of magnitude. Large depletion widths may pose certain problems, such as allowing RF or DC signals to interfere to neighboring devices, or possibly to the back of the wafer.

Figure 6:
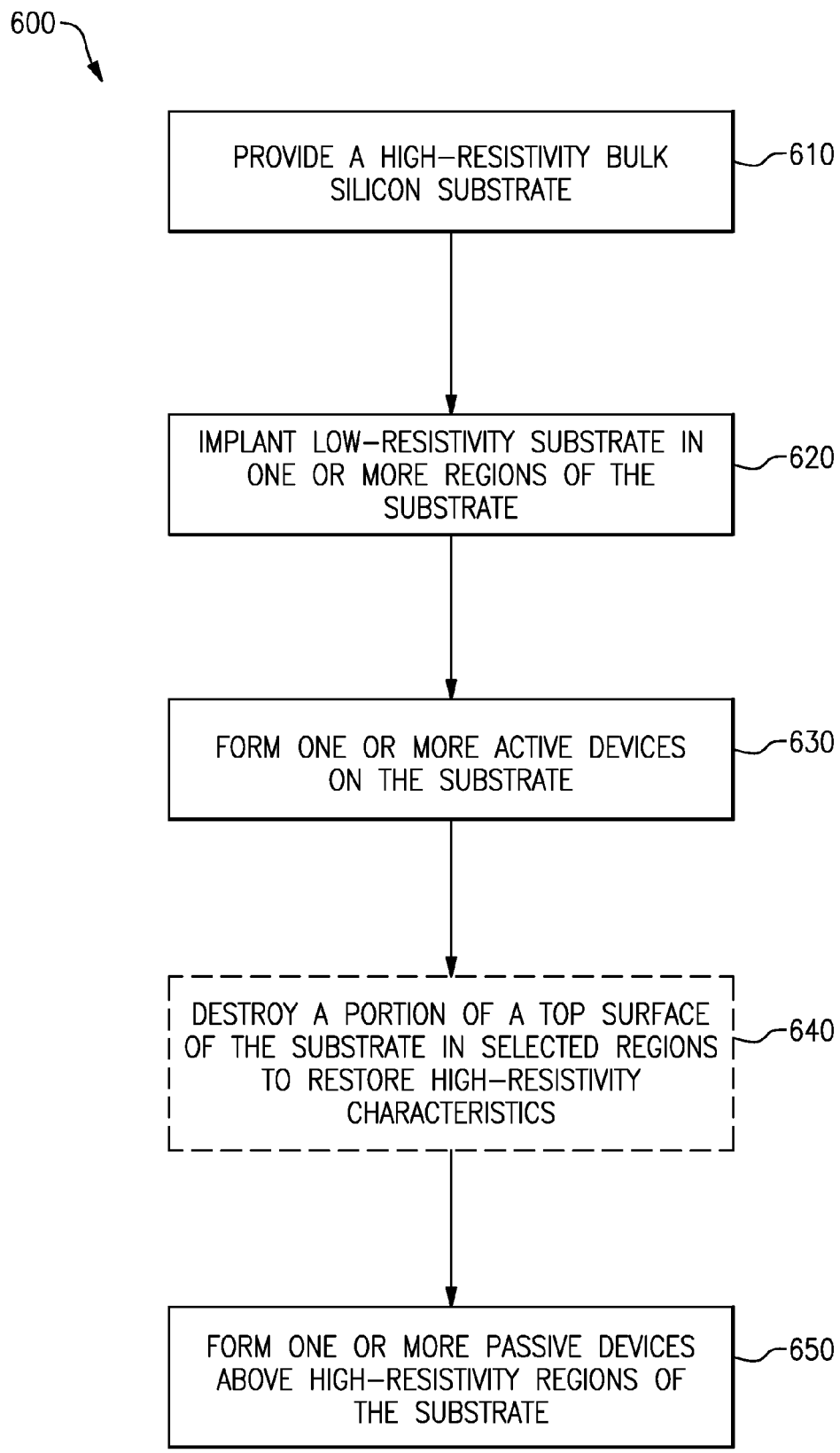
FIG. 6 illustrates a flow chart for a process for implementing a high-resistivity substrate in an integrated FEM device in accordance one or more features of with the present disclosure.

FIG. 6 is a flow chart for a process 600 for implementing a high-resistivity layer or substrate adjacent to SiGe BiCMOS technology elements and integrating FEM components into a single die. In certain preferred embodiments, the process is carried out in a manner that minimizes the losses of RF signals associated with dual-band signals within circuits, signal dispersion, and parasitic junction capacitances of active technology elements. The process involves providing at least a portion of a high-resistivity bulk silicon substrate at block 610, which may be grown, for example, using a silicon seed. When growing the high-resistivity substrate, it may be desirable to do so in such a manner as to maintain a resistivity that has relatively tight control, which may depend largely on the amount of oxygen precipitate (Oi) present in the substrate. That is, it may be desirable to grow a substrate whose resistivity and intrinsic carrier type (p versus n) is not prone to substantial alteration during subsequent processing. In certain embodiments, excess oxygen precipitate in the bulk substrate can cause type-conversion of the substrate during manufacturing of the SiGe and CMOS processes, such as from p-type to n-type. Type conversion can lead to substantial increase in depletion widths, causing interference cross-talk or punch-through between devices.

As illustrated above in connection with FIGS. 5B, 5D, the process 600 may further include implanting, at block 620, low-resistivity implant in certain regions of the wafer. For example, such low-resistivity implant may be configured such that various RF devices may be at least partially surrounded by the implant, and/or various non-RF devices may be formed on the implant. The low-resistivity implant may allow for effective contact between one or more devices and the underlying substrate by limiting depletion width.

At block 630, one or more active devices are formed on the substrate. Examples of such devices may include transistors of various types. One or more passive devices (resistors, inductors, etc.) may be formed on the substrate at block 650. Passive devices may be advantageously formed above regions of the substrate where the surface has been treated to return the substrate to high-resistivity at or near its surface. In certain embodiments, the process 600 allows for integration of RF devices, such as power amplifiers, on high-resistivity silicon substrate.

As described above, during manufacturing process of high-resistivity silicon wafers, an epitaxial layer of relatively low-resistivity silicon may form on an upper surface of the wafer. Therefore, the process 600 may include a step 640 that involves destroying at least a portion of the low-resistivity epitaxial layer in selected regions to restore high-resistivity characteristics of the substrate in those regions. This step is illustrated at block 640, and may be performed by treating the surface of the substrate with Argon gas, thereby at least partially destroying the crystal lattice in that region.

Figure 7:
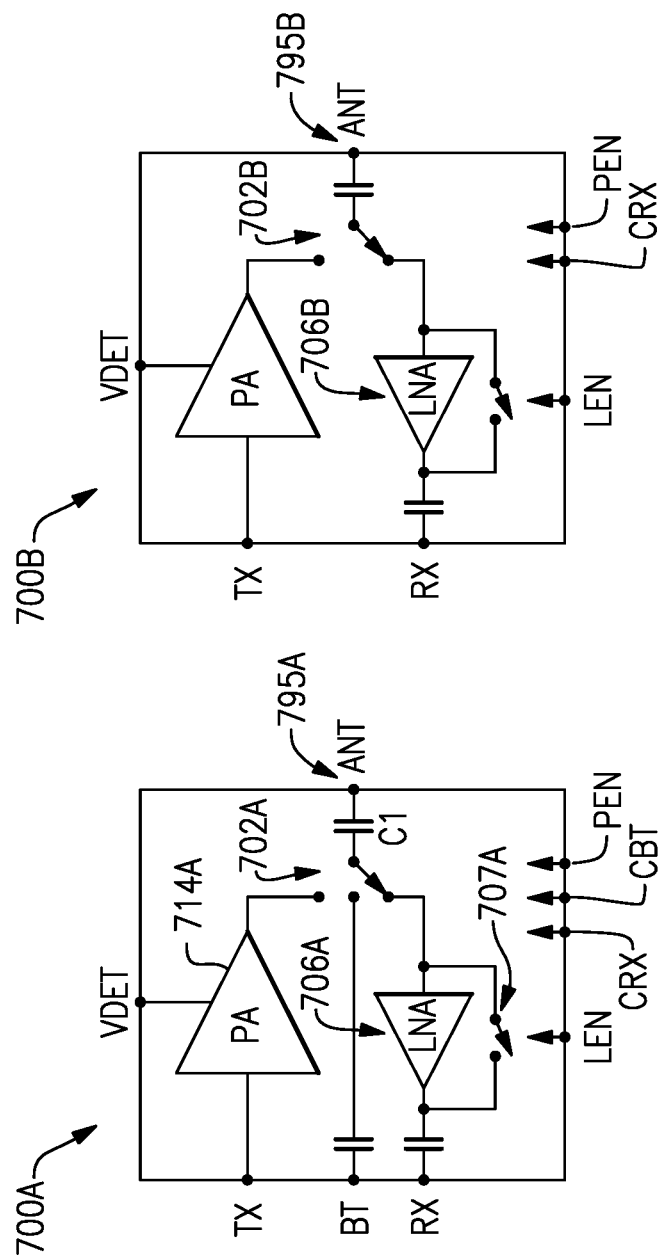
FIGS. 7A-7B illustrate example layouts of embodiments of front-end modules in accordance with one or more features of the present disclosure.

FIGS. 7A-7B illustrate example layouts of embodiments of front-end modules that may incorporate one or more of the features disclosed herein. FEMs may be designed according to any suitable configuration, based on, for example, application specifications or requirements. The depicted FEMs may comprise one or more elements or devices that are not shown in the diagrams. Furthermore, the FEMs shown in FIGS. 7A-7B may be integrated, as described above.

FIG. 7A illustrates a schematic diagram of an embodiment of an FEM 700A such as a FEM configured for WLAN operation. The FEM 700A shown in FIG. 7A is a single band front-end module. For example, the FEM 700A may be configured to operate at or around 2.4 GHz (g-band). As shown, the FEM 704 connects to an antenna port 795A via a switch 702A. The line connecting the switch 702A to the antenna port may include one or more passive devices, such as the capacitor C1. The FEM 700A includes a transmitter path and a receiver path. The transmitter path includes a power amplifier 714A, which may be connected to a detector input, as shown. When the switch 702A is in a first position, a path is formed between the transmitter portion and the antenna. The FEM 700A further includes a low noise amplifier 706A as part of a receiver portion of the FEM. In addition, the receiver portion includes a bypass branch having a switch 707A, which is controlled by a control input. When the switch is engaged, signal provided from the antenna may bypass the low noise amplifier 706A. Certain embodiments in which the FEM 700A is integrated using SiGe BiCMOS technology, the switch 707A may advantageously be integrated with passive devices and/or other devices included in the FEM 700A.

The front-end module 700B shown in FIG. 7B is also a single band front FEM. For example the front-end module may be configured for operation at about the 5 GHz frequency range (a-band). The FIGS. 7A and 7B may differ in that FIG. 7A shows a three-position switch (SP3), whereas the front-end module of FIG. 7B includes a two-position switch (SP2) 702B. FIGS. 7A and 7B may correspond to g-band and a-band operation, respectively.

As shown in FIGS. 7A and 7B, FEMs in accordance with certain aspects of the present disclosure may include one or more switches (702A, 702B) for switching between transmitting and receiving modes, different bands of operation, or other uses. However, in certain embodiments, one or more diplexer filters are included in an FEM in addition to, or in place of, one or more switches. Integration of FEMs as described herein may advantageously allow for integration of such diplexers with other front-end IC components. For example, certain embodiments provide dual-band transceiver functionality using a combination of diplexer filters and switches to alternate between low-band/high-band, and receiver/transmitter mode.

Figure 8:
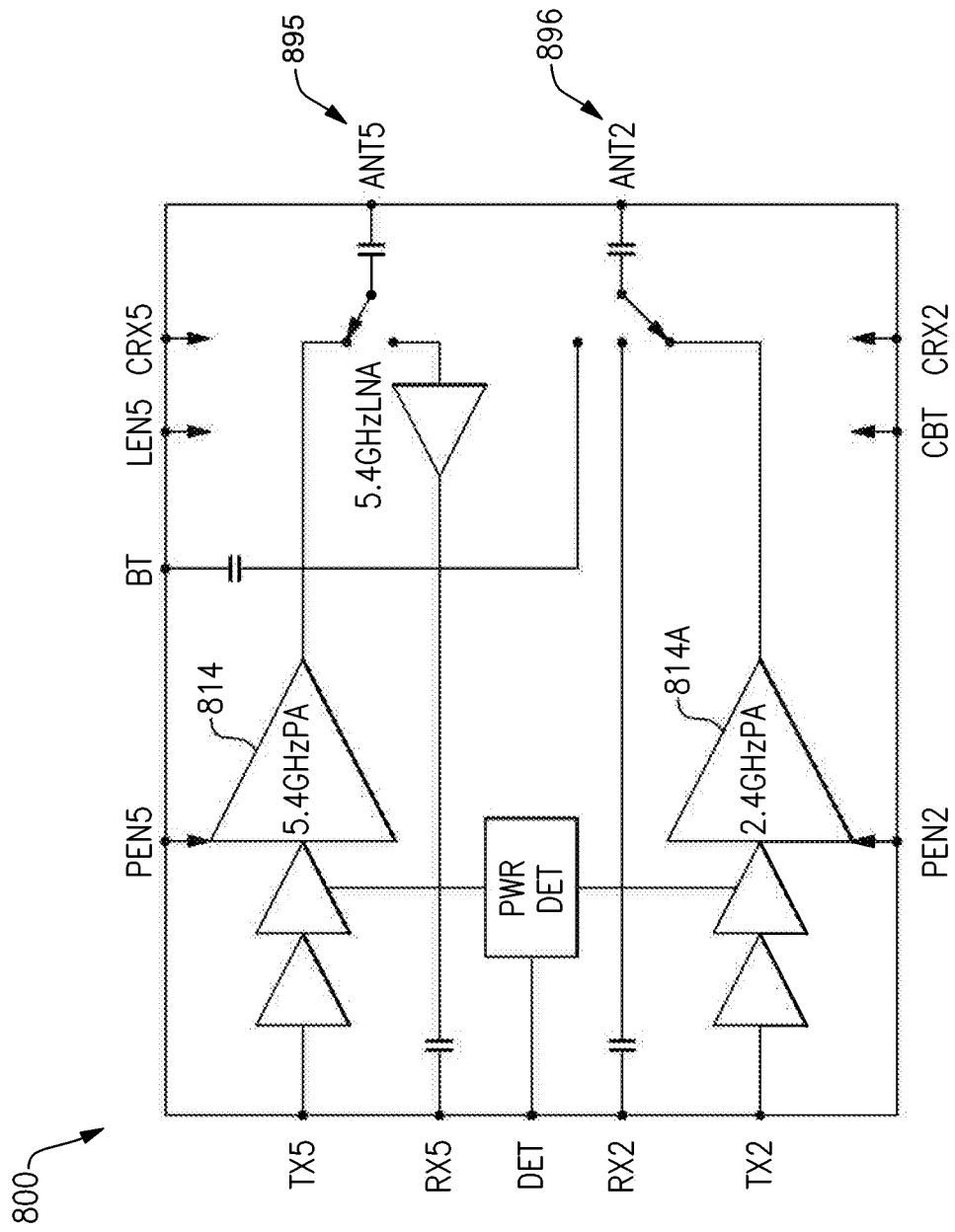
FIG. 8 illustrates an embodiment of a dual-band front-end module in accordance with one or more features of the present disclosure.

In certain embodiments, a FEM may comprise dual band architecture. FIG. 8 illustrates an embodiment of a dual-band FEM comprising g-band and a-band operational circuitry. The FEM 800 includes two separate switches, one for each of the two bands. In certain embodiments, the FEM 800 includes a single switch for both bands, such as a four or five-position switch. The FEM 800 shown further includes two antennas (895, 896), each antenna being associated with a separate band of operation. In certain embodiments, the front-end module is configured to operate in a 2.4 GHz g-band, as well as to 5 GHz a-band. Each band includes both a receiver and a transmitter portion. The receiver and/or transmitter portions may include one or more amplifiers, as discussed above. Such amplifiers may be single stage or multistage amplifiers. For example, the power amplifiers (814A and 814B) shown are three stage amplifiers. Furthermore the FEM 800 may include one or more filters (not shown). In certain embodiments, some or all of the components of FEM 800 are integrated in a single die using SiGe BiCMOS technology, as described herein.

Figure 9:
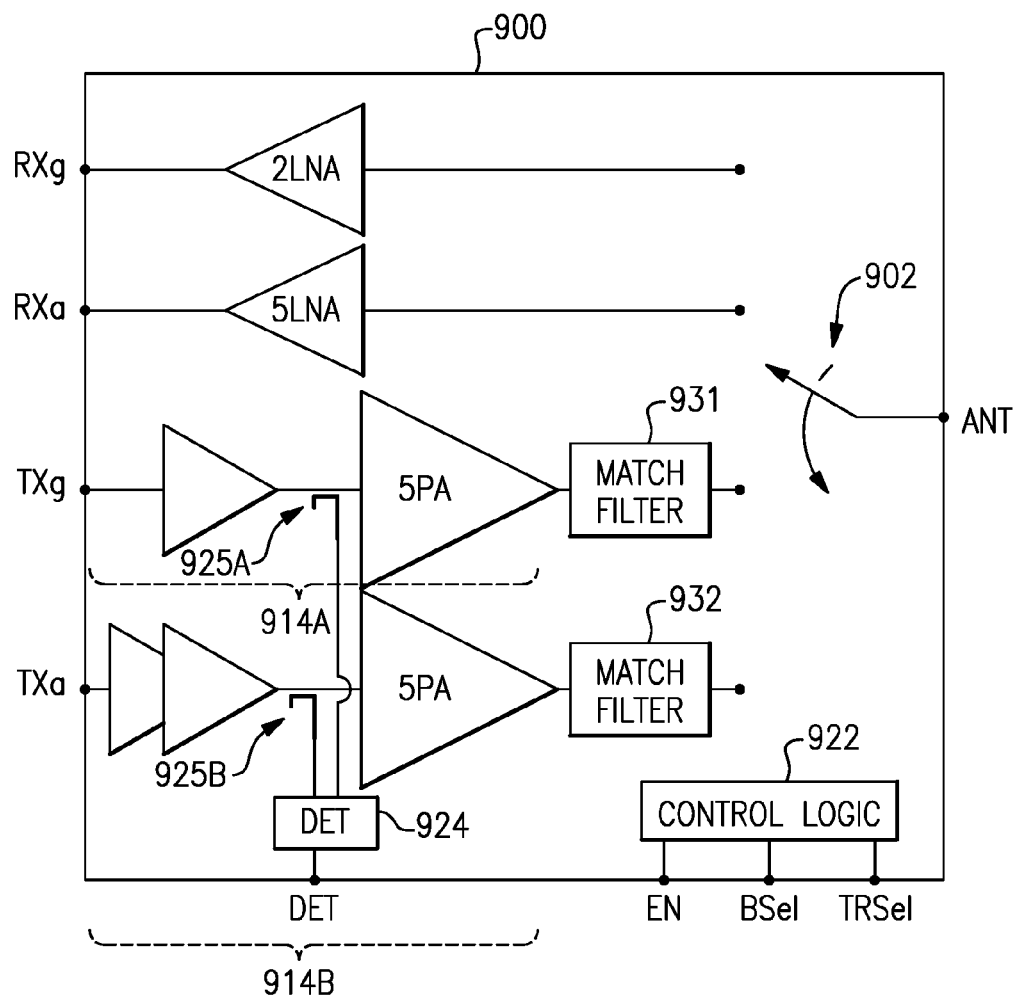
FIG. 9 illustrates a schematic diagram of an integrated front-end module in accordance with one or more features of the present disclosure.

FIG. 9 provides a schematic diagram of an integrated front-end module 900 in accordance with one or more embodiments disclosed herein. The FEM 900 is a dual band module configured for operation in both the 2.4 GHz band (g-band) and the 5 GHz band (a-band). Although the FEM 900 shown is described in the context of a dual-band 2.4 GHz and 5 GHz FEM, it should be understood that the features described herein may have applicability in front-end modules configured for operation in one or more other bands.

The FEM 900 includes an antenna port 995 that is coupled to a switch having four positions. Two of the positions of the antenna correspond to receiver paths of the front-end module, one for the 2.4 GHz band, and another for the 5 GHz band. The remaining two positions of the switch correspond to transmitter paths of the FEM 900, one for each of the relevant bands, similarly to the receiver portion. The FEM 900 comprises a two-stage power amplifier 914A in connection with the g-band mode of operation and a three stage amplifier 914B in connection with the a-band mode of operation. Each band of the transmitter portion may include one or more matched filters for matching impedance between the power amplifiers and, for example, the antenna, or other components of a wireless device. The FEM 900 further includes a control logic module 922 for controlling one or more elements of the front-end module, such as the switch 902.

The FEM 900 includes a detector module 924 for detecting a signal on one or more lines of the transmitter portion to provide data for use in output power regulation. In connection with the detector module 924, the FEM 900 may include one or more couplers (925A, 925B), such as directional couplers, or other types of couplers. The couplers 925A, 925B enable power coupling between the transmitter portion and the detector module 924. In some implementations, power detection can be realized at an inter-stage matching circuit between a driver and output stage. Power detection at an intermediate stage may be generally proportional to the actual output power. Furthermore, by coupling to the transmitter portion at a position other than the output of the amplifier may advantageously provide at least partial isolation from antenna mismatch, such that power-reading stability is improved.

Figure 10B:
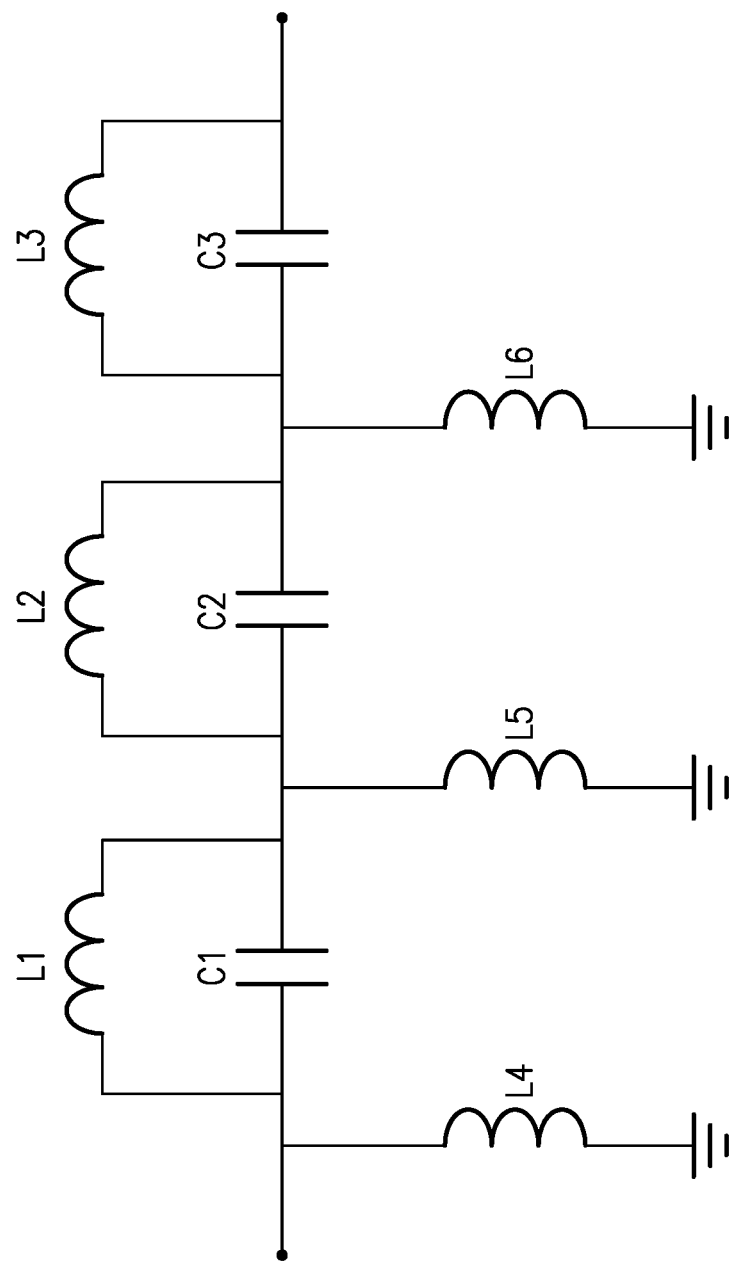
Figure 11:
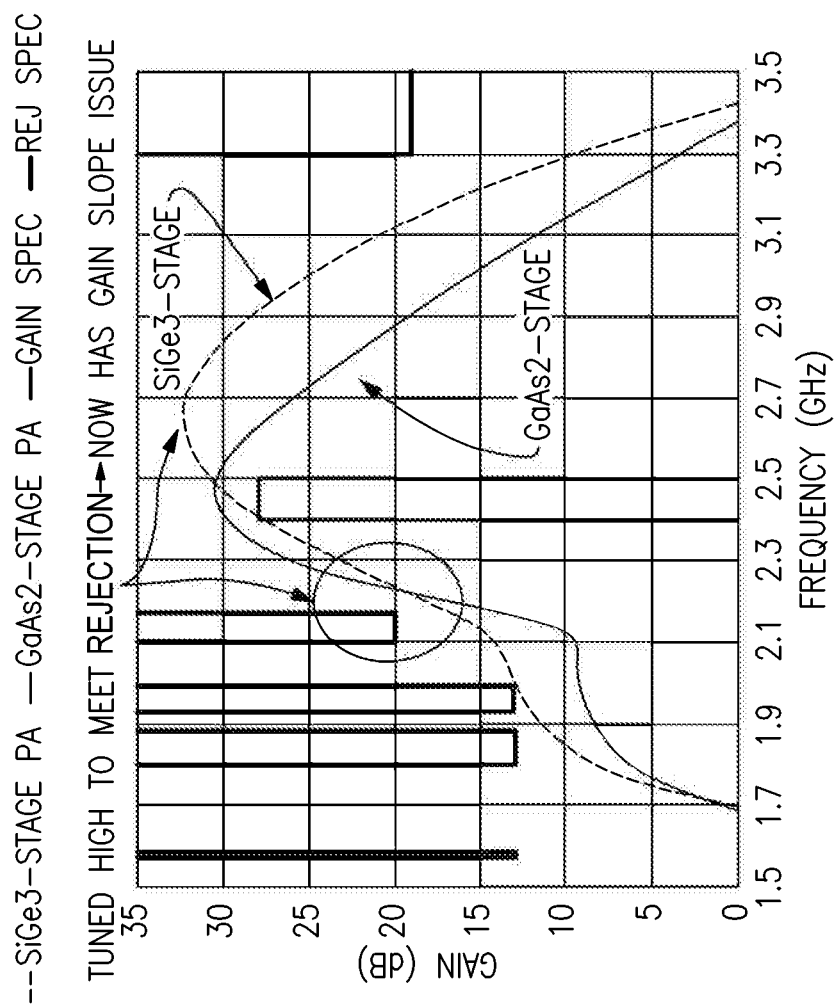
FIG. 11 is a graph illustrating gain and rejection specifications associated with the 802.11 ac wireless communication standard.

Embodiments of front-end modules disclosed herein may be configured to conform to band gain and rejection specifications of one or more wireless communication standards, such as 802.11ac (see FIG. 11 for 802.11ac band gain/rejection specifications). In 802.11ac compliant FEM's constructed using gallium arsenide substrate, coexistence filtering may be implemented using, for example, a fifth order band-pass power amplifier filter. FIG. 10A illustrates an embodiment of a fifth order band-pass filter that may be used with 2-stage GaAs FEM's operating at 2.4 GHz frequency. The filter of FIG. 10A includes high Q inductors on semi-insulating GaAs substrate. The various devices illustrated in FIG. 10A may take any desirable value. For example, in certain embodiments, devices have values equal to or approximately equal to the following: C1=3.0 pF; C2=4.8 pF; C3=3.0 pF; C4=3.3 pF; C5=3.3 pF; L1=1.6 nH; L2=1.2 nH; and L3=1.2 nH.

Satisfactory gain/rejection characteristics may be difficult to achieve in 2-stage SiGe implementations using low-resistivity bulk substrate due to intrinsically higher insertion loss of corresponding filter implementations. However, in certain embodiments, 3-stage SiGe amplifiers may used with 6-th order elliptical filtering to achieve adequate performance. Three stages may be required, as opposed to two, due to increases in loss from higher-order filtering and low-resistivity bulk silicon substrate. Therefore, with respect to low-resistivity SiGe-based technologies, it may be desirable to implement coexistence filtering using a sixth-order elliptical filter, in order to meet 802.11ac specifications. FIG. 10B illustrates an embodiment of a sixth-order elliptical filter that may be used in SiGe-based 802.11ac compliant FEM's. The various devices illustrated in FIG. 10B may take any desirable value. For example, in certain embodiments, devices have values equal to or approximately equal to the following: C1=1.5 pF; C2=7.3 pF; C3=5.0 pF; L1=6.4 nH; L2=0.7 nH; L3=1.2 nH; L4=4.4 nH; L5=4.0 nH; and L6=5.4 nH.

FIG. 11 shows potential performance of a 3-stage low-resistivity SiGe FEM utilizing a filter like that shown in FIG. 10B vis-à-vis 2-stage GaAs performance. As is illustrated in FIG. 11, gain may need to be boosted in such an SiGe embodiment in order to meet the gain requirements at 2.4-2.5 GHz. Such gain increase may be achieved with an additional high-frequency pre-driver stage, thereby requiring an additional gain stage. Such in-band gain slope issues may make low-resistivity SiGe-based solutions less desirable in certain respects than other solutions (e.g., GaAs-based solutions).

However, high-resistivity SiGe solutions, as described herein, may allow for 802.11ac compliant FEMs to utilize 2-stage solutions that are comparable to 2-stage GaAs performance. Such 2-stage solutions may advantageously provide satisfactory performance without the additional increases in current consumption, physical size, and overall increase in circuit complexity that may be required to accommodate a $6^{th}$ order filter, like that shown in FIG. 10B.

FIGS. 12A-12D illustrate embodiments of packaging configurations for FEM modules including, for example, power amplifier modules, low noise amplifier modules, and switches. In the embodiments of FIGS. 12A and 12C, the FEM comprises two separate dies (designated "U1" and "U2"), which collectively provide the FEM functionality. The two dies are connected at various regions by wire bonds. In addition, the dies are connected via wire bonds to connection pads on a circuit board or lead frame package on which the two dies are disposed.

With respect to FIGS. 12B and 12D, the FEM comprises a singular integrated die (designated "U1"), which provides all necessary FEM functionality. The FEM of FIG. 12B may be an integrated FEM in accordance with embodiments described above. For example, the FEM may comprise BiCMOS SiGe technology, which may allow for integration of the various components of the FEM, as described above. As is shown, the FEM of FIGS. 12B and 12D occupies a smaller package footprint and profile than the FEM shown in FIGS. 12A and 12C. This decrease in space required to accommodate the FEM of FIGS. 12B and 12D may allow for more compact wireless device design. As demand increases for smaller and smaller electronic devices, integration of FEM components into a single die may become increasingly desirable.

While various embodiments of integrated front-end modules have been described, it will be apparent to those of ordinary skill in the art that many more embodiments and implementations are possible. For example, embodiments of integrated FEMs are applicable to different types of wireless communication devices, incorporating various FEM components. In addition, embodiments of integrated FEMs are applicable to systems where compact, high-performance design is desired. Some of the embodiments described herein can be utilized in connection with wireless devices such as mobile phones. However, one or more features described herein can be used for any other systems or apparatus that utilize of RF signals.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A semiconductor device for an integrated front-end module comprising:
a silicon substrate having a high-resistivity portion;
an active radio frequency device disposed on the substrate above the high-resistivity portion;
a low-resistivity well disposed a first distance away from the active radio frequency device and providing at least partial electrical isolation between the active radio frequency device and a passive device; and a trench disposed between the active radio frequency device and the low-resistivity well, the trench configured to impede movement across the trench of carriers in the high resistivity portion of the silicon substrate.

2. The semiconductor device of claim 1 wherein the active radio frequency device is a transistor and the low-resistivity well at least partially surrounds a collector of the transistor.

3. The semiconductor device of claim 1 wherein the trench is spaced apart from the active radio frequency device and spaced apart from the low-resistivity well.

4. The semiconductor device of claim 1 wherein the trench is disposed immediately adjacent to the low-resistivity well.

5. The semiconductor device of claim 1 further comprising a low-resistivity epitaxial layer of a different impurity type than an impurity type of the silicon substrate, the low-resistivity epitaxial layer disposed above the silicon substrate.

6. The semiconductor device of claim 1 further comprising a high-resistivity region disposed a second distance from the active radio frequency device and at least partially surrounding the active radio frequency device, the second distance greater than the first distance.

7. The semiconductor device of claim 6 wherein the passive device is disposed directly above the high-resistivity region.

8. The semiconductor device of claim 1 wherein the low-resistivity well at least partially surrounds the active radio frequency device.

9. A wireless device comprising:
a front-end module including a silicon substrate, an active radio frequency device, a low-resistivity well, and a trench, the silicon substrate having a high-resistivity portion, the active radio frequency device disposed on the substrate above the high-resistivity portion, the low-resistivity well disposed a first distance away from the active radio frequency device, the low-resistivity well providing at least partial electrical isolation between the active radio frequency device and a passive device, the trench disposed between the active radio frequency device and the low-resistivity well, and the trench configured to impede movement across the trench of carriers in the high resistivity portion of the silicon substrate; and
an antenna in electrical communication with the front-end module, the antenna configured to receive and transmit wireless signals.

10. The wireless device of claim 9 wherein the active radio frequency device is a transistor and the low-resistivity well at least partially surrounds a collector of the transistor.

11. The wireless device of claim 9 wherein the trench is spaced apart from the active radio frequency device and spaced apart from the low-resistivity well.

12. The wireless device of claim 9 wherein the trench is disposed immediately adjacent to the low-resistivity well.

13. The wireless device of claim 9 wherein the front-end module further includes a low-resistivity epitaxial layer of a different impurity type than an impurity type of the silicon substrate, the low-resistivity epitaxial layer disposed above the silicon substrate.

14. The wireless device of claim 9 wherein the front-end module further includes a high-resistivity region disposed a second distance from the active radio frequency device and at least partially surrounding the active radio frequency device, the second distance greater than the first distance.

15. The wireless device of claim 14 wherein the passive device is disposed directly above the high-resistivity region.

16. A method of fabricating a front-end module, the method comprising:
creating, from a silicon wafer, a silicon substrate having a high-resistivity portion;
disposing an active radio frequency device on the substrate above the high-resistivity portion;
forming a low-resistivity well at least partially around the active radio frequency device and a first distance away from the active radio frequency device, the low-resistivity well providing at least partial electrical isolation between the active radio frequency device and a passive device; and
forming a trench between the active radio frequency device and the low-resistivity well, the trench configured to impede movement across the trench of carriers in the high resistivity portion of the silicon substrate.

17. The method of claim 16 further comprising forming a low-resistivity epitaxial layer of a different impurity type than an impurity type of the silicon substrate.

18. The method of claim 17 wherein forming the low-resistivity epitaxial layer includes causing a low-resistivity material to out-diffuse from a sub-collector region of the silicon substrate and to form on a surface of the silicon substrate.

19. The method of claim 16 further comprising forming a high-resistivity region a second distance from the active radio frequency device that is greater than the first distance, the high-resistivity region at least partially surrounding the active radio frequency device.

20. The method of claim 19 wherein forming the high-resistivity region includes treating a top layer of the silicon substrate with a crystal lattice destroying agent.

* * * * *